(12) United States Patent
Han et al.

(10) Patent No.: US 11,195,891 B2
(45) Date of Patent: *Dec. 7, 2021

(54) DISPLAY DEVICE HAVING FILM WITH GROOVE

(71) Applicant: SAMSUNG DISPLAY CO., LTD., Yongin-si (KR)

(72) Inventors: Junghoon Han, Uiwang-si (KR); Jihoon Kim, Cheonan-si (KR); Daeseung Mun, Cheonan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/995,198

(22) Filed: Aug. 17, 2020

(65) Prior Publication Data

US 2020/0381496 A1 Dec. 3, 2020

Related U.S. Application Data

(63) Continuation of application No. 15/783,101, filed on Oct. 13, 2017, now Pat. No. 10,748,973.

(30) Foreign Application Priority Data

Nov. 25, 2016 (KR) .......................... 10-2016-0158645

(51) Int. Cl.
*H01L 27/32* (2006.01)
*G09G 3/3225* (2016.01)
(Continued)

(52) U.S. Cl.
CPC ....... *H01L 27/3244* (2013.01); *G09G 3/3225* (2013.01); *H01L 51/524* (2013.01); *H01L 51/0097* (2013.01)

(58) Field of Classification Search
CPC .......................... H01L 27/3244; H01L 51/524
(Continued)

(56) References Cited

U.S. PATENT DOCUMENTS

2013/0169515 A1 7/2013 Prushinskiy et al.
2015/0146386 A1* 5/2015 Namkung ........... H01L 51/0097
361/749

(Continued)

FOREIGN PATENT DOCUMENTS

JP 5589977 9/2014
JP 2015174103 10/2015
(Continued)

*Primary Examiner* — Thao X Le
*Assistant Examiner* — Xia L Cross
(74) *Attorney, Agent, or Firm* — F. Chau & Associates, LLC

(57) ABSTRACT

A display device includes a display panel including a lower surface, an upper surface facing the lower surface, and a first area, a first film positioned below the lower surface and provided with a film groove defined therein overlapping with the first area, a second film disposed on the upper surface, and an adhesive layer disposed between the lower surface of the display panel and the first film and provided with an adhesive groove defined therein overlapping with the first area. The first area extends across the display panel along a first direction, one side surface of the adhesive groove is defined by one line when viewed in a cross section taken along a second direction crossing the first direction, and one side surface of the film groove is defined by two or more lines when viewed in the cross section taken along the second direction.

20 Claims, 24 Drawing Sheets

(51) Int. Cl.
*H01L 51/52* (2006.01)
*H01L 51/00* (2006.01)

(58) Field of Classification Search
USPC .......................................................... 257/40
See application file for complete search history.

(56) References Cited

U.S. PATENT DOCUMENTS

| | | | |
|---|---|---|---|
| 2015/0227172 A1* | 8/2015 | Namkung | H01L 27/3267 345/173 |
| 2017/0360188 A1 | 3/2017 | Han et al. | |
| 2017/0358772 A1 | 12/2017 | Sung et al. | |
| 2018/0151644 A1 | 5/2018 | Han et al. | |

FOREIGN PATENT DOCUMENTS

| | | |
|---|---|---|
| KR | 1020150007632 | 1/2015 |
| KR | 1020150062237 | 6/2015 |
| KR | 1020150094989 | 8/2015 |
| KR | 1020170140490 | 12/2017 |

* cited by examiner

DISPLAY DEVICE HAVING FILM WITH GROOVE

CROSS-REFERENCE TO RELATED APPLICATION

This application is a continuation application of U.S. application Ser. No. 15/783,101 filed on Oct. 13, 2017 which claims priority under 35 U.S.C. § 119 to Korean Patent Application No. 10-2016-0158645, filed on Nov. 25, 2016, the disclosure of which is incorporated by reference herein in its entirety.

1. Technical Field

Exemplary embodiments of the present invention relate to a display device, and more particularly to a method of manufacturing the same.

2. Discussion of Related Art

An organic light emitting display device may include a plurality of pixels. Each pixel may include an organic light emitting element and a circuit unit controlling the organic light emitting element. The circuit unit may include a control transistor, a driving transistor, and a storage capacitor.

The organic light emitting element may include an anode, a cathode, and an organic light emitting layer disposed between the anode and the cathode. The organic light emitting element may emit light when a voltage equal to or greater than a threshold voltage is applied to the organic light emitting layer disposed between the anode and the cathode.

SUMMARY

An exemplary embodiment of the present invention provides a bendable display device having a relatively small radius of curvature.

An exemplary embodiment of the present invention provides a method of manufacturing the display device.

An exemplary embodiment of the present invention provides a display device including a display panel including a lower surface, an upper surface facing the lower surface, and a first area defined therein, a first film disposed on the lower surface of the display panel and provided with a film groove defined therein overlapping with the first area, a second film disposed on the upper surface of the display panel, and an adhesive layer disposed between the lower surface of the display panel and the first film and provided with an adhesive groove defined therein overlapping with the first area. The first area crosses the display panel along a first direction, one side surface of the adhesive groove is defined by one line when viewed in a cross section taken along a second direction crossing the first direction, and one side surface of the film groove is defined by two or more lines when viewed in the cross section taken along the second direction.

The adhesive groove may have a first width in the second direction. The film groove may include a first sub-film groove having a second width in the second direction and a second sub-film groove having a third width in the second direction. The first sub-film groove may be positioned between the adhesive groove and the second sub-film groove. The first width, the second width, and the third width may satisfy the Equation of first width≤second width<third width.

The adhesive groove may have a first height perpendicular to the first width. The first sub-film groove may have a second height perpendicular to the second width. The second sub-film groove may have a third height perpendicular to the third width. A sum of the first width and the second width may be greater than the third width.

The display device may include a burr formed on a lower surface of the first film in contact with the film groove. The burr may have a thickness equal to or greater than about 1 micrometer and equal to or smaller than about 10 micrometers.

The one side surface of the film groove may be stepped.

The one side surface of the second sub-film groove may be a curved surface.

The one side surface of the second sub-film groove is an inclined surface.

The one side surface of the first sub-film groove is an inclined surface.

The one side surface of the film groove is defined by two inclined surfaces and one surface connecting the two inclined surfaces.

A first portion of the lower surface of the display panel in the first area may be exposed by the film groove and the adhesive groove.

Each of the one side surface of the film groove and the one side surface of the adhesive groove forms an acute angle with a second portion of the display panel, and the second portion corresponds to the lower surface of the display panel disposed outside the first area.

Each of the one side surface of the first sub-film groove and the one side surface of the second sub-film groove forms an acute angle with a second portion of the display panel, the second portion corresponds to the lower surface of the display panel disposed outside the first area, and the angle between the one side surface of the second sub-film groove and the second portion of the display panel is smaller than the angle between the one side surface of the first sub-film groove and the second portion of the display panel.

The display panel may include a base substrate forming the lower surface of the display panel and including polyimide. A driving layer may be disposed on the base substrate. An organic light emitting element may be disposed on the driving layer. A sealing layer may substantially cover an upper surface of the organic light emitting element.

The display panel may include a display area displaying an image and a non-display area disposed adjacent to the display area. The first area may be defined in the non-display area.

The display device may be bent with respect to a reference axis defined in the first area and extending in the first direction.

The first film may include polyethylene terephthalate. The second film may include a polarizing plate.

An exemplary embodiment of the present invention provides a method of manufacturing a display device includes forming a display module including a display panel including a lower surface and an upper surface. A first film is positioned under the lower surface of the display panel. A second film is disposed on the upper surface of the display panel. An adhesive layer is disposed between the lower surface of the display panel and the first film, and a second area defined therein, irradiating a first laser beam along an edge of the second area to cut the first film and the adhesive layer, irradiating a second laser beam to a burr formed on the lower surface of the first film disposed outside the second area to remove the burr, and removing a portion of the first film and a portion of the adhesive layer, which are positioned in the second area.

The irradiating the second laser beam may be performed after the irradiating of the first laser beam and before the removing of the portion of the first film and the portion of the first adhesive layer.

A focal position of the first laser beam and a focal position of the second laser beam may be spaced apart from each other.

Each of the first laser beam and the second laser beam may be a $CO_2$ laser beam or an ultraviolet laser beam.

The irradiating the first laser beam may include irradiating the first laser beam in an upward direction toward the upper surface from the lower surface of the display panel to cut the first film and the adhesive layer.

The irradiating the second laser beam may include irradiating the second laser beam to the burr along the upward direction to remove the burr.

The irradiating the second laser beam may include removing the burr and a portion, at which the burr is formed, of the lower surface of the first film.

The second laser beam may have an intensity substantially equal to or smaller than an intensity of the first laser beam.

The second laser beam may have an irradiation speed substantially equal to or faster than an irradiation speed of the first laser beam.

The display module may include a display area displaying an image and a non-display area disposed adjacent to the display area. The second area may be defined in the non-display area.

The second area may cross the display module in a first direction when viewed in a plan view. Irradiating the first laser beam may include irradiating the first laser beam to a first edge of the second area extending in the first direction and irradiating the first laser beam to a second edge of the second area extending in the first direction and facing the first edge of the second area.

The method further includes bending the display module with respect to a reference axis defined in the second area and extending in the first direction.

The method further includes weakening an adhesive force of a first adhesive portion disposed in the second area of the adhesive layer to be weaker than an adhesive force of a second adhesive portion disposed outside the second area of the adhesive layer, and the weakening of the adhesive force is performed before the irradiating of the first laser beam.

The weakening the adhesive force is performed by irradiating an ultraviolet ray to the second area along an upper direction toward the upper surface from under the display panel.

An exemplary embodiment of the present invention provides a display device including a display panel including a lower surface, an upper surface facing the lower surface, and a first area defined therein, a first film disposed under the lower surface of the display panel and including a film groove defined therein overlapping with the first area, a second film disposed on the upper surface of the display panel, and an adhesive layer disposed between the lower surface of the display panel and the first film and including an adhesive groove defined therein overlapping with the first area. The film groove is stepped.

According to an exemplary embodiment of the present invention, the groove may be defined in the first film and the adhesive layer to overlap with the bending area, and thus the display module may be easily bent in the bending area and the radius of the curvature of the display module may be reduced.

According to an exemplary embodiment of the present invention, defects caused by the burr may be minimized or prevented from occurring.

According to a manufacturing method of the display device according to an exemplary embodiment of the present invention, the burr formed by the laser beam process is removed by another process following the laser beam process, and thus defects caused by the burr may be minimized in the display device.

BRIEF DESCRIPTION OF THE FIGURES

The above and other features of the present invention will become more apparent by describing in detail exemplary embodiments thereof with reference to the accompanying drawings, in which.

DETAILED DESCRIPTION

Figure 1:
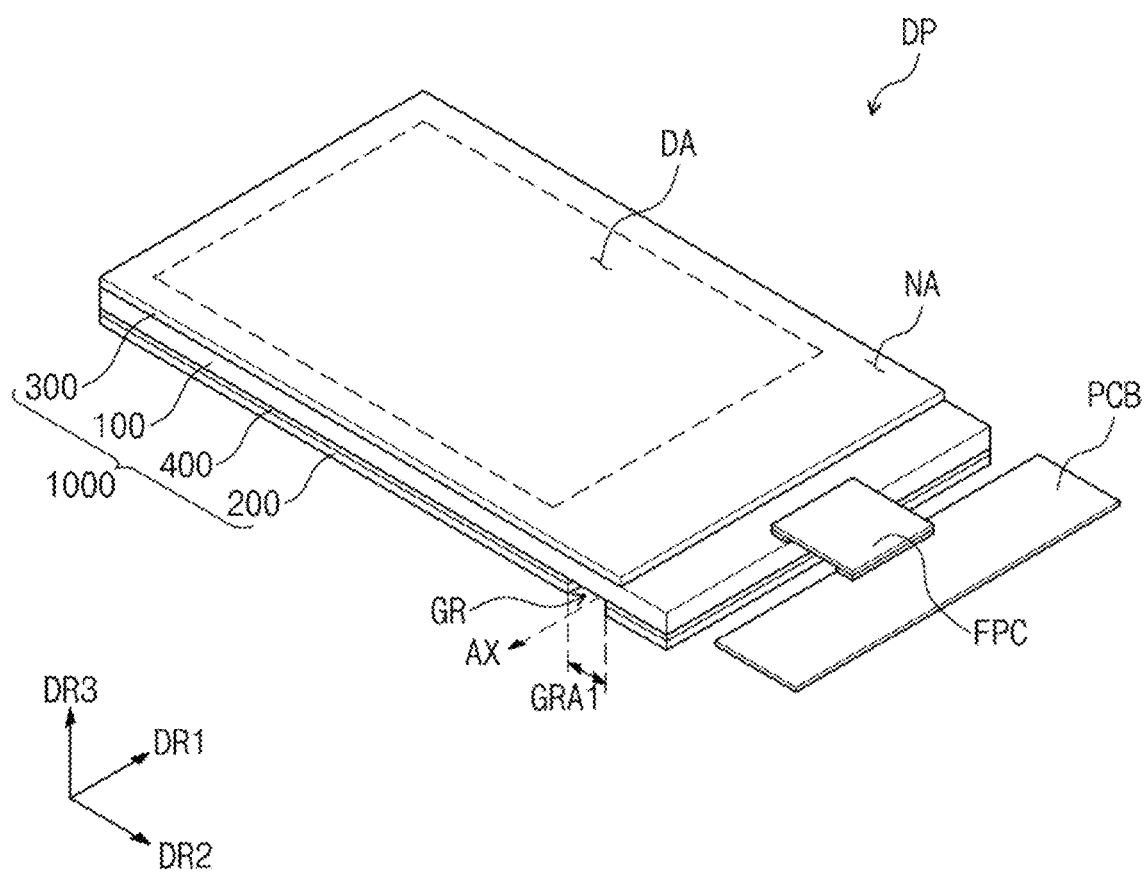
FIG. 1 is a perspective view showing an organic light emitting display device according to an exemplary embodiment of the present invention.

Exemplary embodiments of the present invention will be described below in more detail with reference to the accompanying drawings. In this regard, the exemplary embodiments may have different forms and should not be construed as being limited to the exemplary embodiments of the present invention described herein.

In the drawings, the thickness of layers, films, and regions may be exaggerated for clarity.

It will be understood that although the terms "first" and "second" may be used herein to describe various components, these components should not be limited by these terms.

A display device according to an exemplary embodiment of the present invention will be described in more detail below (e.g., with reference to FIGS. 1 to 18). An organic light emitting display device according to an exemplary embodiment of the present invention will be described in more detail below.

Figure 2:
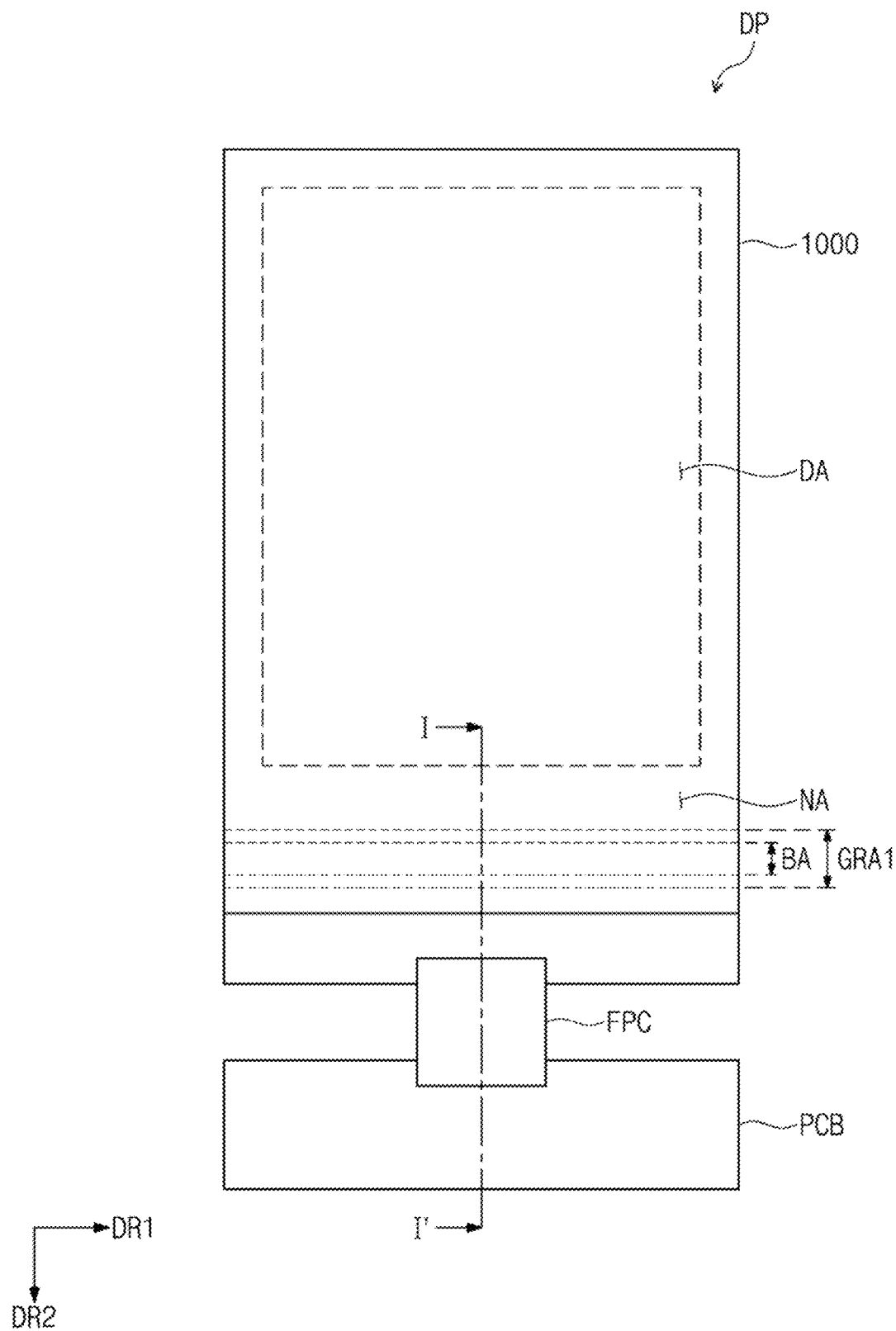
FIG. 2 is a plan view showing the organic light emitting display device of FIG. 1.
Figure 3:
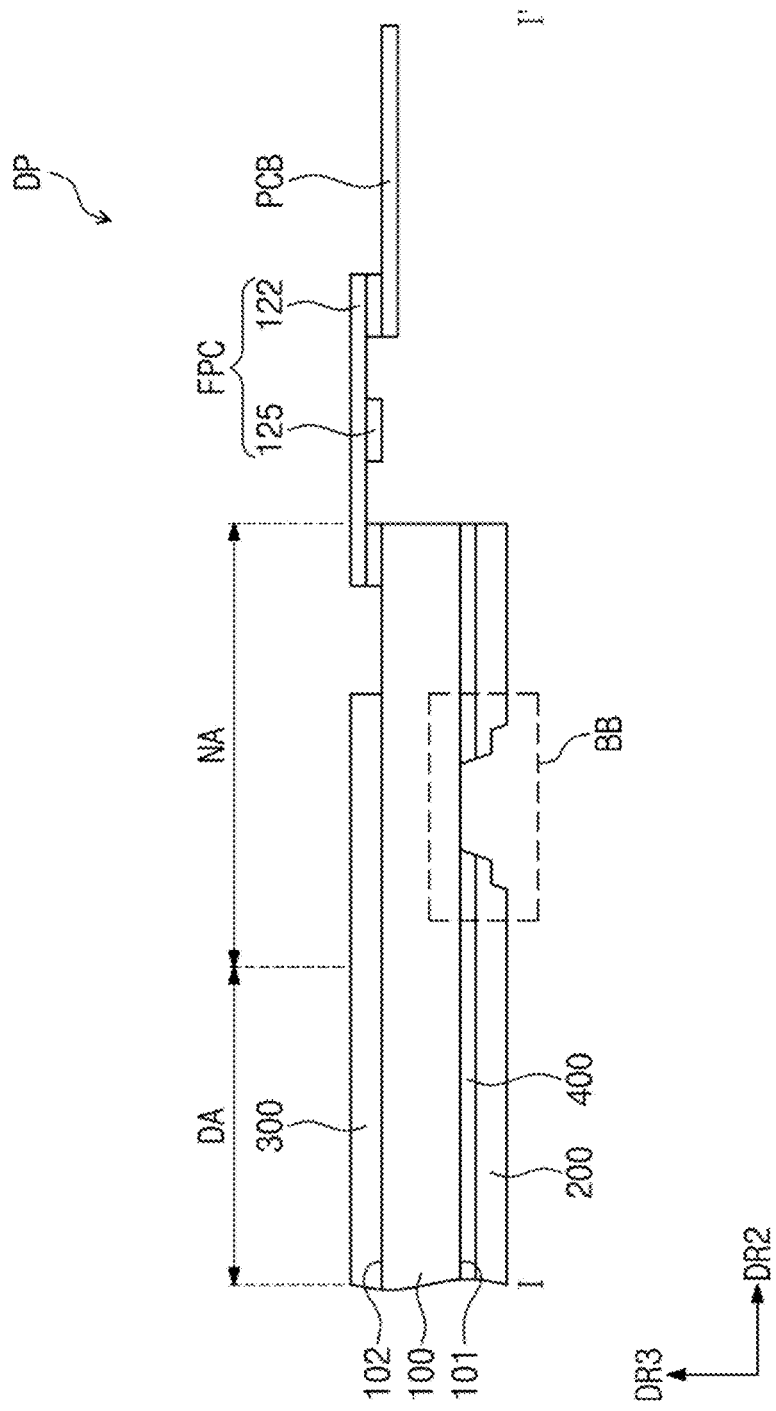
FIG. 3 is a cross-sectional view taken along a line I-I' of FIG. 2.
Figure 4:
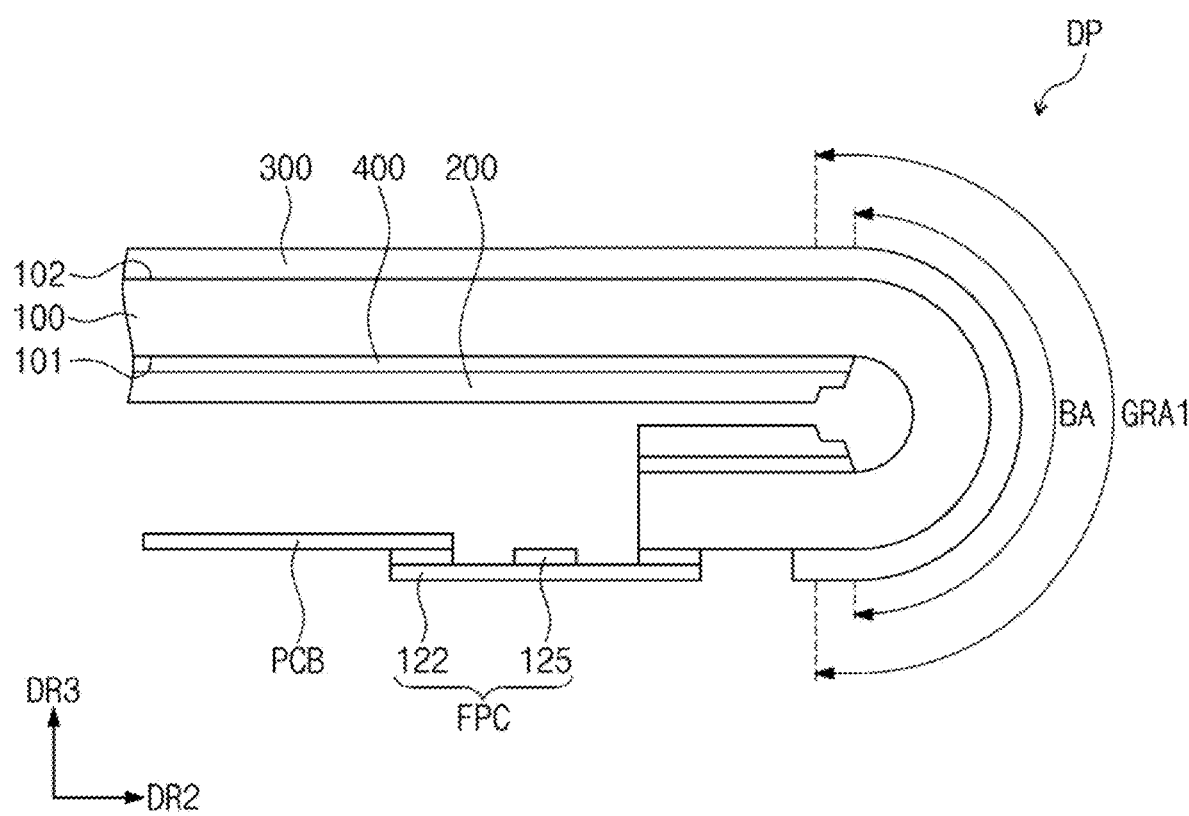
FIG. 4 is a cross-sectional view taken along a line II-II' to show the organic light emitting device that is bent.

FIG. 1 is a perspective view showing an organic light emitting display device according to an exemplary embodiment of the present invention. FIG. 2 is a plan view showing the organic light emitting display device of FIG. 1. FIG. 3 is a cross-sectional view taken along a line I-I' of FIG. 2. FIG. 4 is a cross-sectional view taken along a line II-II' to show the organic light emitting device that is bent.

FIG. 1 is a perspective view showing an organic light emitting display device DP according to an exemplary embodiment of the present invention. FIG. 2 is a plan view showing the organic light emitting display device DP of FIG. 1. FIG. 3 is a cross-sectional view taken along a line I-I' of FIG. 2. FIG. 4 is a cross-sectional view taken along a line II-II' to show the organic light emitting device DP that is bent.

Referring to FIGS. 1 to 4, the organic light emitting display device DP may include a display module 1000, a flexible printed circuit board FPC, and a printed circuit board PCB.

The flexible printed circuit board FPC may include a flexible line substrate 122 and a driving circuit chip 125. The driving circuit chip 125 may be electrically connected to lines of the flexible line substrate 122.

In the case that the flexible printed circuit board FPC includes the driving circuit chip 125, data pads electrically connected to data lines and control signal pads electrically connected to control signal lines may be arranged in a pad area of a display panel 100. The data lines may be connected to transistors arranged in pixels, and the control signal lines may be connected to a scan driving circuit. According to an exemplary embodiment of the present invention, the flexible printed circuit board FPC may have a chip on film (COF) structure; however, exemplary embodiments of the present invention are not limited thereto. According to an exemplary embodiment of the present invention, the driving circuit chip may be disposed in a non-display area, and the flexible printed circuit board FPC may include a flexible line substrate.

The printed circuit board PCB may be electrically connected to the display panel 100 via the flexible line substrate 122 to transmit and receive signals to and from the driving circuit chip 125. The printed circuit board PCB may apply image data, a control signal, and a power source voltage to the display panel 100 or the flexible printed circuit board PCB. The printed circuit board PCB may include a pad part connected to the flexible printed circuit board FPC.

The display module 1000 may display an image in response to signals applied thereto. The display module 1000 may include various display panels. As an example, a display module 1000 including an organic light emitting display panel will be described in more detail below.

Directions in which perpendicular sides of the display module 1000 respectively extend may be referred to herein as a first direction DR1 and a second direction DR2, respectively. The first direction DR1 and the second direction DR2 are each illustrated, for example, in a plan view illustrated in FIG. 2. Referring to FIG. 2, the first direction DR1 corresponds to a direction in which relatively shorter sides of the display module 1000 extend, and the second direction DR2 corresponds to a direction in which relatively longer sides of the display module 1000 extend. However, exemplary embodiments of the present invention are not limited thereto, and the first direction DR1 and the second direction DR2 may be changed with respect to each other according to exemplary embodiments of the present invention.

When viewed in a plan view, the display module 1000 may include a display area DA and a non-display area NA. An image may be displayed in the display area DA and not in the non-display area NA. The non-display area NA may be adjacent to the display area DA. The non-display area NA may surround the display area DA; however, exemplary embodiments of the present invention are not limited thereto.

The display module 1000 may include the display panel 100, a first film 200 positioned under the display panel 100, a second film 300 disposed on the display panel 100, and an adhesive layer 400 disposed between the display panel 100 and the first film 200.

The display panel 100 may include a lower surface 101 and an upper surface 102 facing away from the lower surface 101. A first area GRA1 may be defined in the display panel 100. The first area GRA1 may be defined in the non-display area NA. The first area GRA1 may be defined to cross the display panel 100 along the first direction DR1 when viewed in a plan view. A direction, which is orthogonal to the lower surface 101 or the upper surface 102 of the display panel 100, from the lower surface 101 to the upper surface 102 may be referred to herein as a third direction DR3. The display panel 100 may display an image along the third direction DR3.

A groove GR defined by removing a portion of the first film 200 and a portion of the adhesive layer 400 in the first area GRA1. The groove GR may be stepped. When viewed in a cross-sectional view along the second direction DR2, the groove GR may have a plane figure defined by five or more line segments, and at least one line of the five lines defining the plane figure is substantially parallel to a first direction axis, is positioned in the first area GRA1, and corresponds to an imaginary line extending from the lower surface of the first film 200.

The term "groove" used herein may refer to a thru-hole or a recess provided with one closed surface.

The term "plane figure" used herein may refer to a figure of straight lines, a figure of curved lines, and a figure of straight lines and curved lines.

The display module 1000 may be bent with respect to a reference axis AX extending in the first direction DR1. The reference axis AX may be defined under the display module 1000. The display module 1000 may be bent such that two portions, which are separated from each other by the groove, of the first film 200 are close to each other.

The display module 1000 may be bent in the first area GRA1. A bending area BA may be defined in the display module 1000. The display module 1000 may be substantially flat except for in the bending area BA. The bending area BA may have a width smaller than that of the first area GRA1. As an example, the first area GRA1 may be defined in the display module 1000 to cross the display panel 100 along the first direction DR1 when viewed in a plan view, and the display module 1000 may be bent with respect to the reference axis AX defined in the first area GRA1 and extending in the first direction DR1.

The adhesive layer 400 and the first film 200 may have a restoring force when being bent, and thus more force may be applied to bend the display module 1000 and to maintain the bending state as a thickness of the display module 1000 becomes large. Removing some or all of the adhesive layer 400 and the first film 200 in the bending area BA may decrease a minimum force applied to bend the display module 1000. In the display device DP according to an exemplary embodiment of the present invention, since the groove GR is provided in the first film 200 and the adhesive layer 400 to overlap with the bending area BA, the radius of curvature of the display module 1000 may be reduced in the bending area BA. The groove GR will be described in more detail below.

The first film 200 may be positioned under the lower surface 101 of the display panel 100. The second film 300 may be disposed on the upper surface 102 of the display panel 100. The adhesive layer 400 may be disposed between the lower surface 101 of the display panel 100 and the first film 200. The display device DP according to an exemplary embodiment of the present invention may include an adhesive member disposed between the upper surface 102 of the display panel 100 and the second film 300. According to an exemplary embodiment of the present invention, the second film 300 may be directly disposed on the upper surface 102 of the display panel 100.

The first film 200 may protect the display panel 100. The first film 200 may include, for example, polyethylene terephthalate (PET), polyethylene naphthalate (PEN), polypropylene (PP), polycarbonate (PC), polystyrene (PS), polysulfone (PSul), polyethylene (PE), polyphthalamide (PPA), polyethersulfone (PES), polyarylate (PAR), polycarbonate oxide (PCO), or modified polythenylene oxide (MPPO). As an example, the first film 200 including polyethylene terephthalate (PET) will be described in more detail below.

The second film 300 may include a polarizing plate. The polarizing plate may substantially block external light incident thereto from outside the second film 300. The polarizing plate may include a linear polarizing layer and a λ/4 retardation layer. As an example, the linear polarizing layer may be disposed on the λ/4 retardation layer. The external light sequentially passing through the linear polarizing layer and the λ/4 retardation layer may become extinct after being reflected by a lower portion of the polarizing plate (e.g., a cathode of the display panel 100) and passing through the λ/4 retardation layer since the external light does not pass through the linear polarizing layer.

The adhesive layer 400 may attach the display panel 100 to the first film 200. The adhesive layer 400 may include an urethane-based material, an acrylic-based material, or a silicon-based material; however, exemplary embodiments of the present invention are not limited thereto.

FIGS. 5 to 11 are cross-sectional views each showing a portion BB of FIG. 3.

Figure 5:
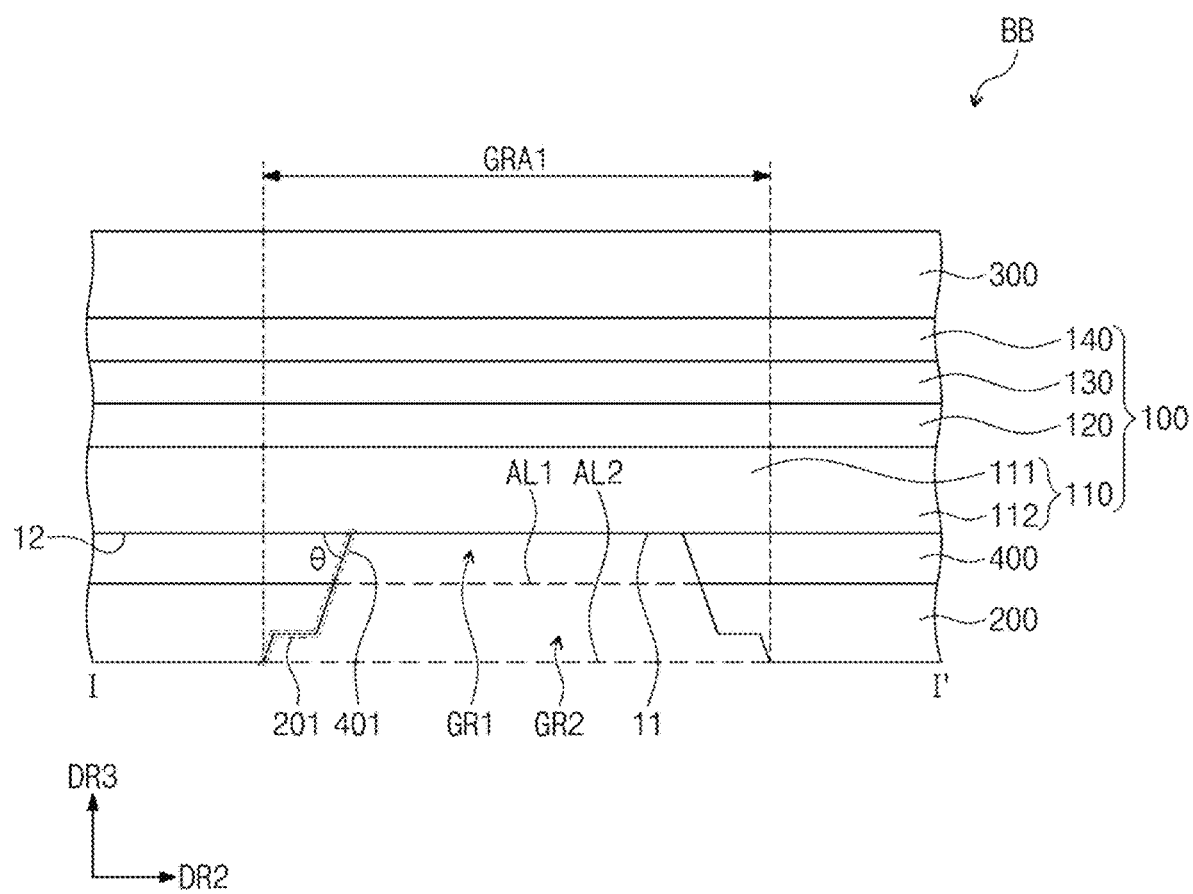
FIGS. 5 to 11 are cross-sectional views each showing a portion BB of FIG. 3.

Referring to FIG. 5, a film groove GR2 may be formed in the first film 200 in the first area GRA1, and an adhesive groove GR1 may be formed in the adhesive layer 400 in the first area GRA1. The film groove GR2 may extend from the adhesive groove GR1. One side surface 401 of the adhesive layer GR1 and one side surface 201 of the film groove GR2 may be connected to each other. The one side surface 401 of the adhesive layer GR1 may correspond to an inner surface of the adhesive layer 400 defining the adhesive groove GR1.

The one side surface 201 of the film layer GR2 may correspond to an inner surface of the first film 200 defining the film groove GR2.

As an example, a cross section in the second direction DR2 of the adhesive groove GR1 has a first plane figure defined by four lines. Among the four lines, one line is a first imaginary line AL1. The first imaginary line AL1 is substantially parallel to the second direction DR2, positioned in the first area GRA1, and corresponds to a line extending from a lower surface of the adhesive layer 400 when viewed in cross section. The first imaginary line AL1 may mean an imaginary line vertically connecting two portions, which are separated from each other by the adhesive groove GR1, of the lower surface of the adhesive layer 400.

The first plane figure may be, but is not limited to, a trapezoid shape or a rectangular shape. For example, the first plane figure may have the trapezoid shape. The adhesive groove GR1 may have the first plane figure defined by four lines on a plane surface substantially parallel to a plane surface defined by the second direction DR2 and the third direction DR3.

A cross section in the second direction DR2 of the film groove GR2 has a second plane figure defined by five lines or more. The five lines include one first imaginary line AL1 and one second imaginary line AL2. The second imaginary line AL2 is substantially parallel to the second direction DR2, positioned in the first area GRA1, and obtained by extending the lower surface of the first film 200 in the cross section taken along the second direction DR2. The second imaginary line AL2 may mean an imaginary line vertically connecting two portions, which are separated from each other by the film groove GR2, of the lower surface of the first film 200. For example, the second plane figure may have an octagonal shape defined by eight lines, but the shape of the second plane figure is not be limited to the octagonal shape. The display panel 100 may include a base substrate 110, a driving layer 120, an organic light emitting element layer 130, and a sealing layer 140.

The base substrate 110 may include the lower surface 101 of the display panel 100. The base substrate 110 may be, but is not limited to, a flexible substrate. The flexible substrate may include a plastic material with relatively high heat resistance and relatively high durability. The flexible substrate may include, e.g., polyethylene terephthalate (PET), polyethylene naphthalate (PEN), polycarbonate (PC), polyarylate (PAR), polyetherimide (PEI), polyethersulfone (PES), or polyimide (PI). As an example, the base substrate 110 including polyimide will be described in more detail below.

The base substrate 110 may be divided into a first base substrate 111 disposed in the first area GRA1 and a second base substrate 112 disposed outside the first area GRA1. The lower surface 101 (see, e.g., FIG. 3) of the display panel 100 may be divided into a first portion disposed in the first area GRA1 and a second portion disposed outside the first area GRA1. The first portion may correspond to a lower surface 11 of the first base substrate 111, and the second portion may correspond to a lower surface 12 of the second base substrate 112. The lower surface 11 of the first base substrate 111 may be exposed by the adhesive groove GR1 and the film groove GR2. The adhesive groove GR1 may be a thru-hole penetrating through the adhesive layer 400, and the film groove GR2 may be a thru-hole penetrating through the first film 200; however, exemplary embodiments of the present invention are not limited thereto.

The driving layer 120 may includes one or more components for transmitting signals to the organic light emitting element layer 130. For example, the driving layer 120 may include a scan line, a data line, a power line, or a light emitting line. The driving layer 120 may include a plurality of transistors and a plurality of capacitors. The transistors may include a switching transistor and a driving transistor Qd (see, e.g., FIG. 12), which may be arranged in every pixel.

The driving layer 120, the organic light emitting element layer 130, and the sealing layer 140 will be described in more detail below.

Each of the adhesive groove GR1 and the film groove GR2 may have a shape with a width gradually decreasing along the third direction DR3 toward the base substrate 100. The one side surface 401 of the adhesive groove GR1 may be inclined with respect to the lower surface 11 of the first base substrate 111.

The one side surface 201 of the film groove GR2 may be stepped. For example, the one side surface 201 of the film groove GR2 may be defined by two inclined surfaces (e.g., inclined with respect to the lower surface 11 of the first base substrate 111) and one surface connecting the two inclined surfaces to each other (e.g., a surface substantially parallel to the lower surface 11 of the first base substrate 111). The one surface connecting the two inclined surfaces to each other may be a surface substantially parallel to the second direction DR2 or an inclined surface; however, exemplary embodiments of the present invention are not limited thereto. As an example, the one side surface 201 of the film groove GR2 may include one inclined surface and one curved surface extending from the inclined surface.

An angle θ between an inclined surface of the one side surface 201 of the film groove GR2 and the bottom surface of the adhesive layer 400 may be an acute angle. An angle θ between the one side surface 401 of the lower surface 11 of the first base substrate 111 may be an acute angle. The angle θ between the inclined surface of the one side surface 201 of the film groove GR2 and the bottom surface of the adhesive layer 400 may be equal to or different from the angle θ between the one side surface 401 of the lower surface 11 of the first base substrate 111.

Figure 6:
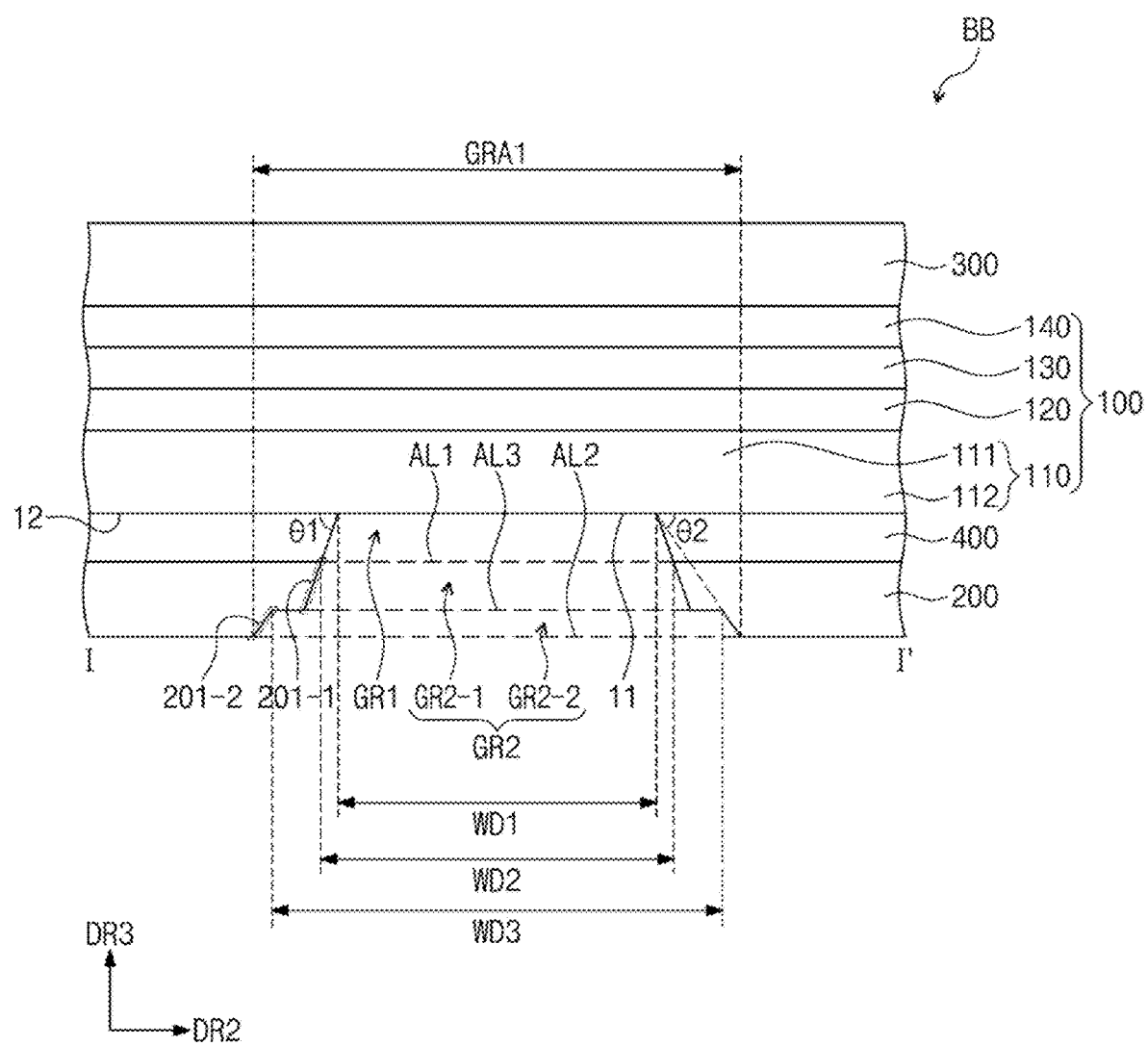

Referring to FIGS. 5 and 6, the film groove GR2 may include a first sub-film groove GR2-1 and a second sub-film groove GR2-2. The first sub-film groove GR2-1 may be positioned between the adhesive groove GR1 and the second sub-film groove GR2-2. The adhesive groove GR1 has a first width WD1 in the second direction DR2, the first sub-film groove GR2-1 has a second width WD2 in the second direction DR2, and the second sub-film groove GR2-2 has a third width WD3 in the second direction DR2.

The first width WD1 is a minimum width of the adhesive groove GR1, the second width WD2 is a minimum width of the first sub-film groove GR2-1, and the third width WD3 is a minimum width of the second sub-film groove GR2-2.

The first width WD1, the second width WD2, and the third width WD3 may satisfy the following Equation 1.

first width≤second width<third width    Equation 1

As an example, the second width WD2 may be greater than the first width WD1. However, the relationships between the first, second, and third widths WD1, WD2 and WD3 are not limited to Equation 1.

A cross-section in the second direction DR2 of the first sub-film groove GR2-1 may have a plane figure defined by four lines. The four lines may include one first imaginary line AL1 and one third imaginary line AL3. The third imaginary line AL3 may be substantially parallel to the second direction DR2 and positioned in the first area GRA1.

A cross-section in the second direction DR2 of the second sub-film groove GR2-2 may have a plane figure defined by four lines. The four lines may include one second imaginary line AL2 and one third imaginary line AL3.

The first sub-film groove GR2-1 may have a shape with a width gradually decreasing along the third direction DR3 toward the display panel 100. The second sub-film groove GR2-2 may have a shape with a width gradually decreasing along the third direction DR3 toward the display panel 100.

An angle θ1 between one side surface 201-1 of the first sub-film groove GR2-1 and the lower surface 11 of the first base substrate 111 may be an acute angle, and an angle θ2 between one side surface 201-2 of the second sub-film groove GR2-2 and the lower surface 11 of the first base substrate 111 may be an acute angle. The one side surface 201-1 of the first sub-film groove GR2-1 corresponds to an inner surface of the first film 200 providing the first sub-film groove GR2-1, and the one side surface 201-2 of the second sub-film groove GR2-2 corresponds to an inner surface of the first film 200 providing the second sub-film groove GR2-2.

The one side surface 201-1 of the first sub-film groove GR2-1 and the one side surface 201-2 of the second sub-film groove GR2-2 may be connected to each other by a horizontal portion of the side surface 201 (see, e.g., FIG. 5). The angle θ2 between the one side surface 201-2 of the second sub-film groove GR2-2 and the lower surface 11 of the first base substrate 111 may be smaller than the angle θ1 between one side surface 201-1 of the first sub-film groove GR2-1 and the lower surface 11 of the first base substrate 111.

The one side surface 201-1 of the first sub-film groove GR2-1 may be an inclined surface with respect to the lower surface 11 of the first base substrate 111.

Figure 7:
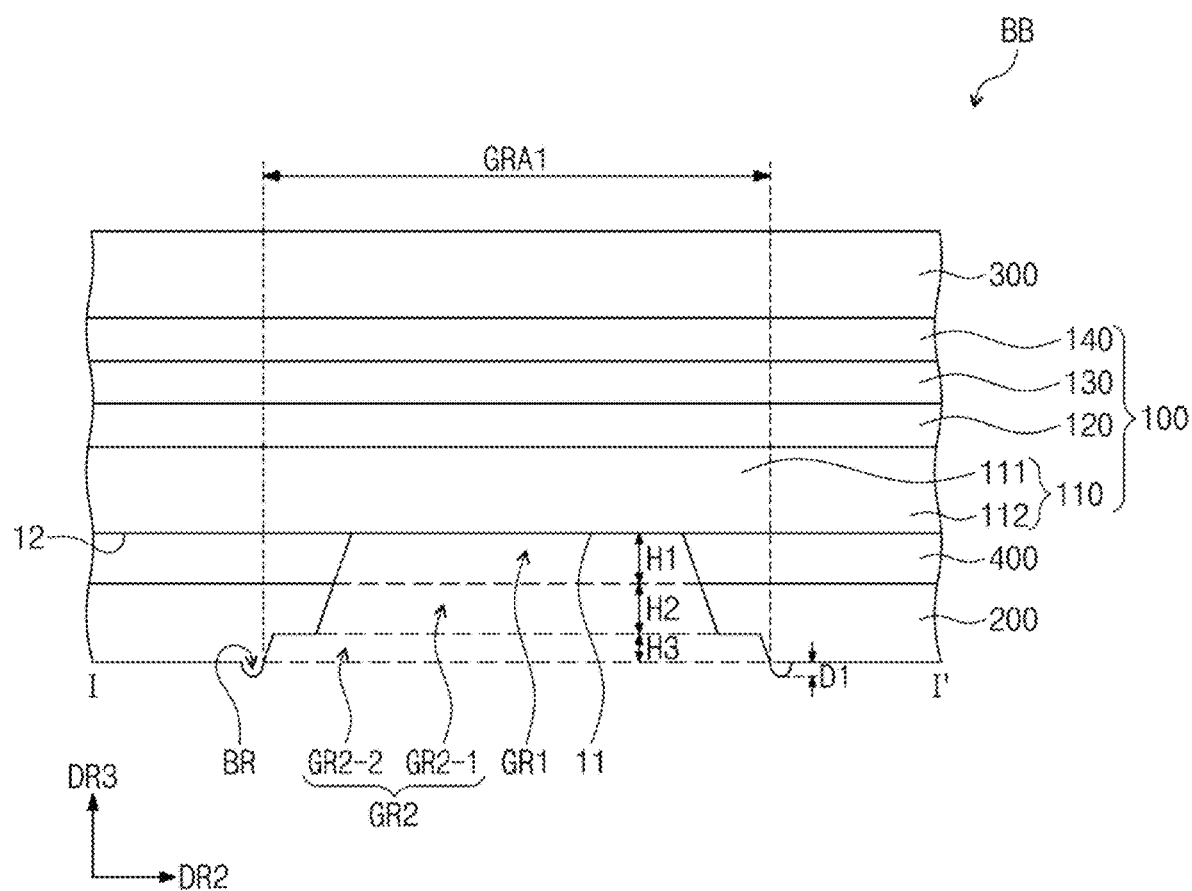

Referring to FIGS. 5 to 7, the adhesive groove GR1 may have a first height H1, the first sub-film groove GR2-1 may have a second height H2, and the second sub-film groove GR2-2 may have a third height H3. The first height H1 may be perpendicular to the first width WD1, the second height H2 may be perpendicular to the second width WD2, and the third height H3 may be perpendicular to the third width WD3. Each of the first height H1, the second height H2, and the third height H3 indicate a length in the third direction DR3. A sum of the first height H1 and the second height H2 may be greater than the third height H3.

According to an exemplary embodiment of the present invention, the second height H2 may be substantially equal to or greater than the third height H3. The first height H1 may be substantially equal to or greater than the second height H2.

The adhesive groove GR1 and the film groove GR2 may be formed by a laser process. The laser process will be described in more detail below.

Figure 24:
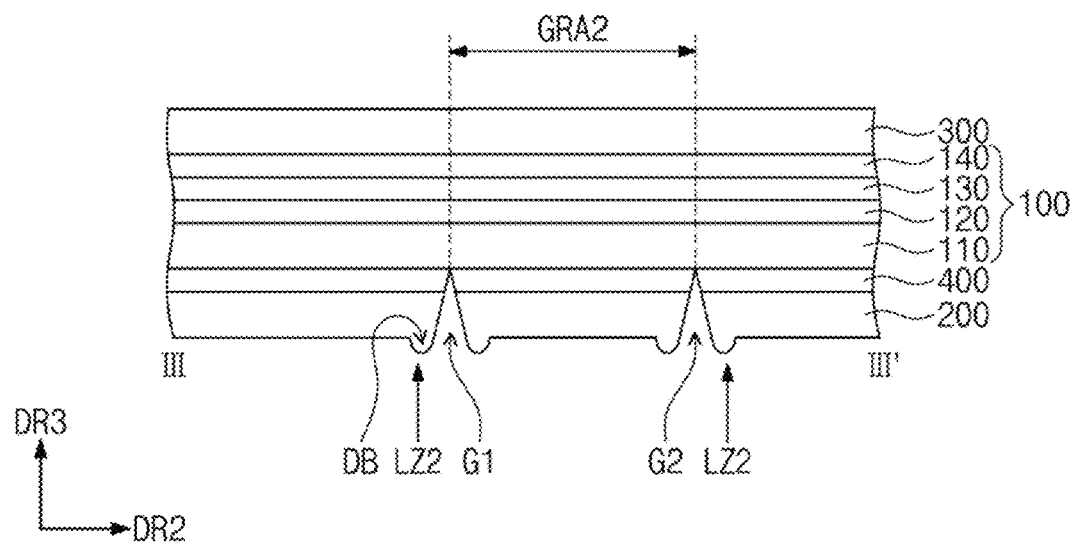

When a laser beam is irradiated to form the adhesive groove GR1 and the film groove GR2, an initial burr, for example, "DB" shown in FIG. 24, may be formed on the lower surface of the first film 200 making contact with the film groove GR2. The initial burr may be formed by a portion of the first film 200, which is melted by a heat energy of the laser beam. In a case that the initial burr has a thickness equal to or greater than a predetermined value, bubbles may be caused when a carrier film is attached for a subsequent process, and thus defects may be caused by the bubbles. In the display according to an exemplary embodiment of the present invention, the laser beam may be irradiated onto the initial burr to remove the initial burr, and a portion of the first film 200 may be removed with the initial burr. Thus, the first sub-film groove GR2-1 and the second sub-film groove GR2-2, which have different widths from each other, may be defined in the first film 200. In this case, an intensity of the laser beam and an irradiation speed of the laser beam may be controlled to remove the initial burr, and thus the thickness of the portion of the first film 200, which is removed by the laser beam irradiated thereon may be reduced. Thus, the third height H3 may be smaller than the sum of the first height H1 and the second height H2.

Another burr having a volume smaller than that of the initial burr may be formed while the initial burr is removed by the laser beam. That is, a burr BR may further be formed on the lower surface of the first film 200 making contact with the film groove GR2. The burr BR formed on the lower surface of the first film may 200 may have a thickness D1 substantially equal to or smaller than about 10 micrometers (µm), e.g., about 7 micrometers (µm). The thickness D1 of the burr BR on the lower surface of the first film 200 may be substantially equal to or greater than about 1 micrometer (µm).

In a case that the thickness D1 of the burr BR on the lower surface of the first film 200 is equal to or smaller than about 10 micrometers (µm), a possibility of process failure caused by the burr BR in a subsequent process may be reduced or eliminated. The smaller the thickness D1 of the burr BR, the lower the likelihood of a process failure caused by the burr BR in a subsequent process will be. In terms of process economics, the thickness D1 of the burr BR may be equal to or greater than about 1 micrometer (µm), while still reducing or eliminating a process failure cause by the burr BR in a subsequent process.

Figure 8:
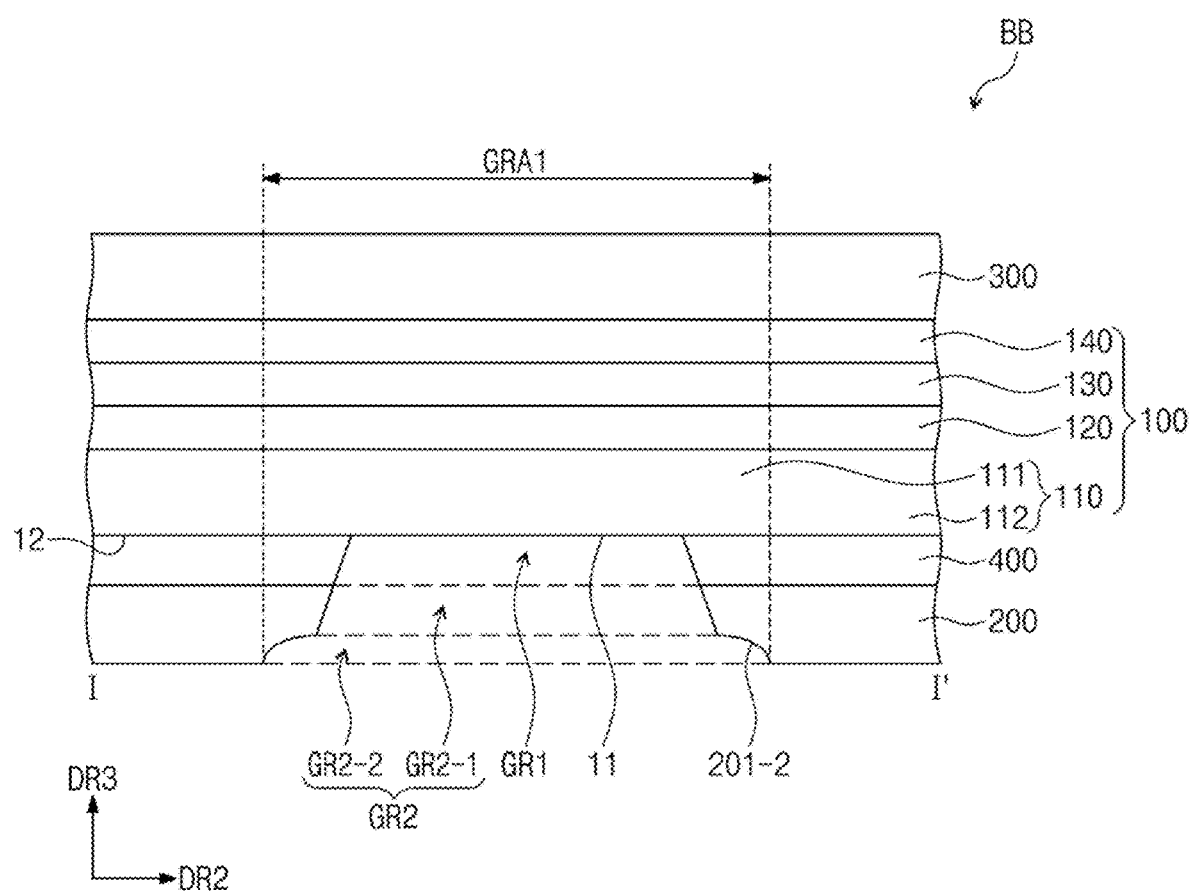

The second plane figure may be defined by a plurality of substantially straight lines; however, exemplary embodiments of the present invention are not limited thereto. Referring to FIG. 8, the second plane figure may be defined by a combination of substantially straight lines and curved lines. The cross-section of the first sub-film groove GR2-1 may have a plane figure defined by a plurality of substantially straight lines. The cross-section of the second sub-film groove GR2-2 may have a plane figure defined by a plurality of substantially straight lines and curved lines. The one side surface 201-2 of the second sub-film groove GR2-2 may be a curved surface. As an example, the one side surface 201-2 of the second sub-film groove GR2-2 may be an inclined surface with respect to the lower surface 11 of the second base substrate 111.

Figure 9:
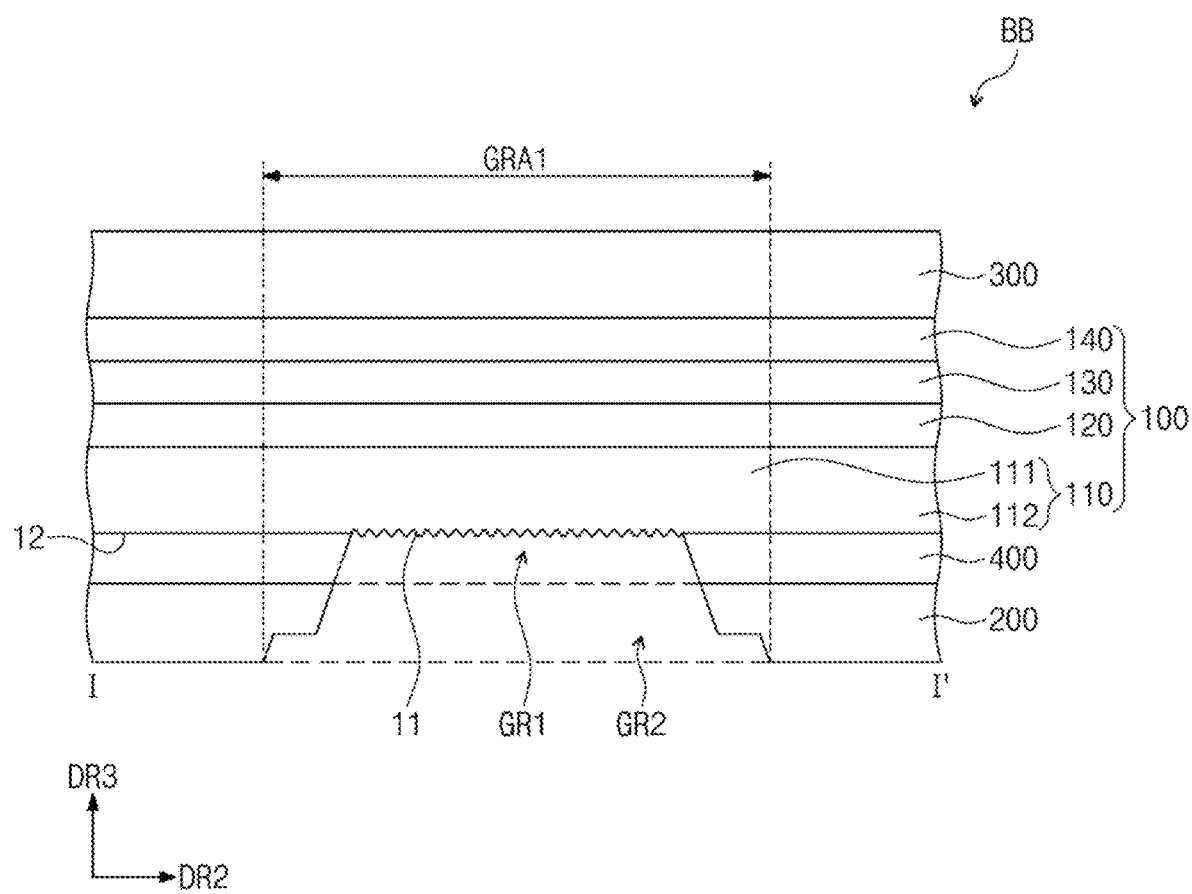

Referring to FIG. 9, a surface roughness of the lower surface 11 of the first base substrate 111 may be greater than a surface roughness of the lower surface 12 of the second base substrate 112. The lower surface 11 of the first base substrate 111 may have a concavo-convex shape. As described above, the lower surface 11 of the first base substrate 111 may be exposed by an adhesive groove GR1 and a film groove GR2; however, exemplary embodiments of the present invention are not limited thereto. The lower surface 12 of the second base substrate 112 may be overlapped with the adhesive layer 400 and the first film 200, and thus the lower surface 12 of the second base substrate 112 need not be exposed.

Figure 10:
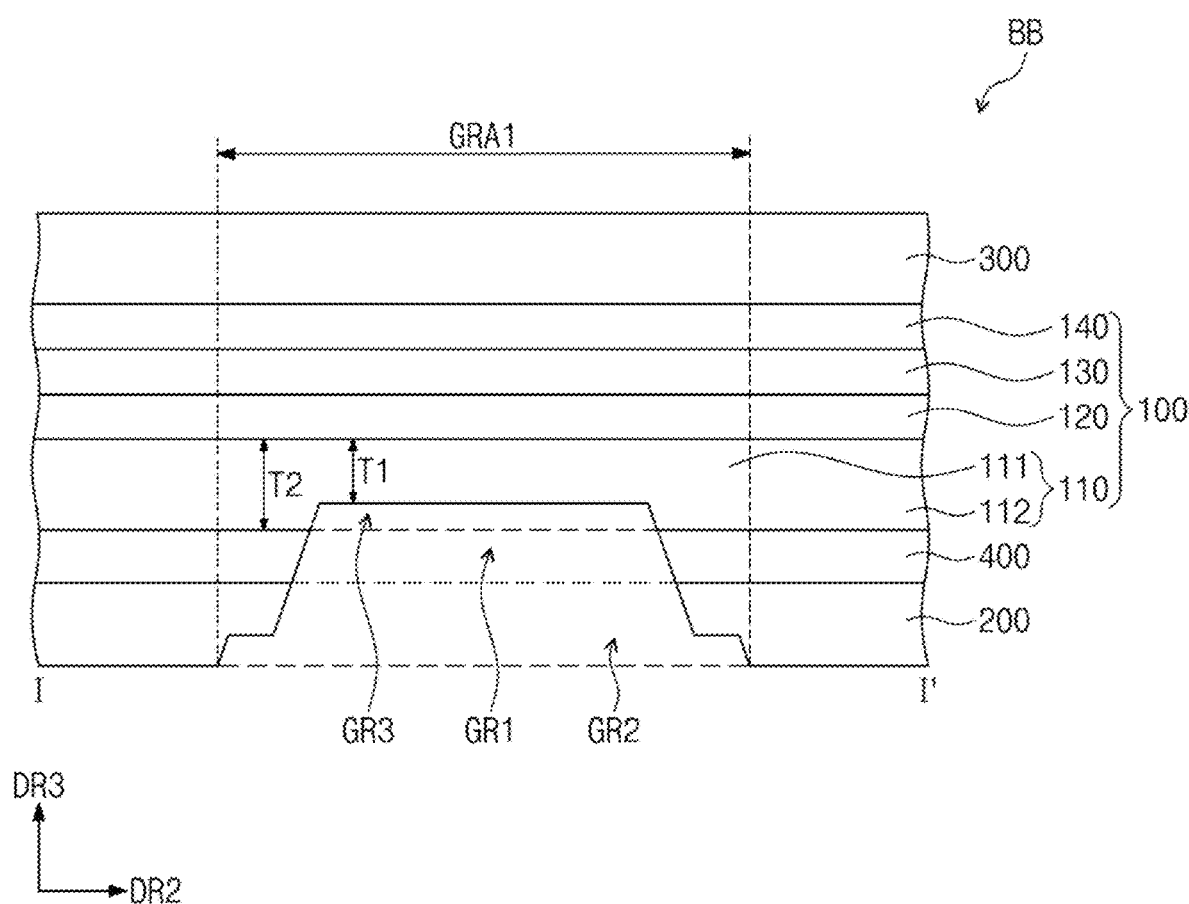

Referring to FIG. 10, the first base substrate 111 may have a first thickness T1, and the second base substrate 112 may have a second thickness T2 greater than the first thickness T1. In this case, the base substrate 110 may include a substrate groove GR3 overlapped with the first area GRA1. The substrate groove GR3 e.g., a recess) might not penetrate through the base substrate 110.

Figure 11:
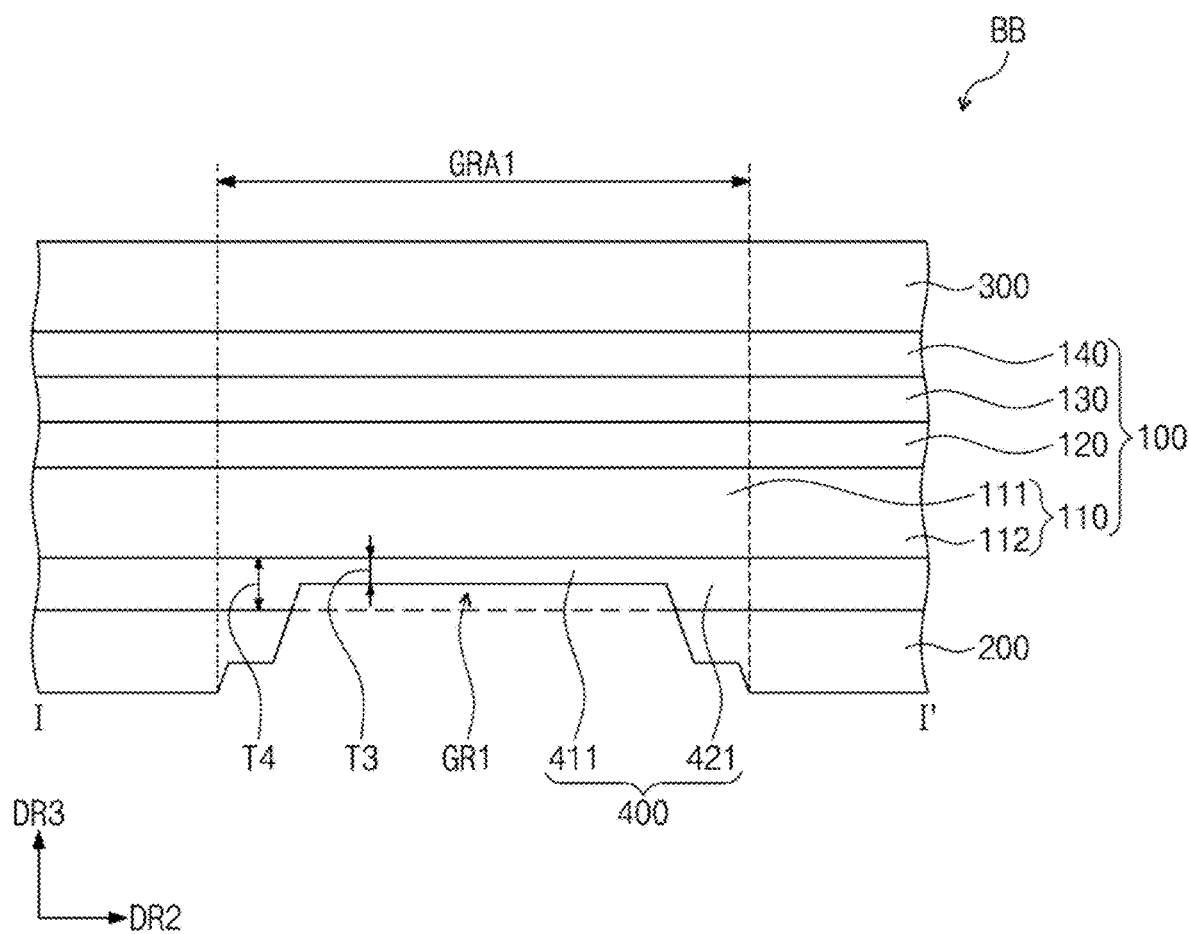

Referring to FIG. 11, the lower surface 11 of the first base substrate 111 may be substantially covered by the adhesive layer 400. The adhesive layer 400 may include a first adhesive layer 411 in which the adhesive groove GR1 is defined and a second adhesive layer 421 in which no adhesive groove GR1 is defined. The adhesive groove GR1 may be a recess provided with one closed surface. The first adhesive layer 411 may be positioned in the first area GRA1. A first portion of the second adhesive layer 421 may be positioned in the first area GRA1, and a second portion of the second adhesive layer 421 may be positioned outside the first area GRA1. The first adhesive layer 411 may have a third thickness T3, and the second adhesive layer 421 may have a fourth thickness T4 greater than the third thickness T3.

Figure 12:
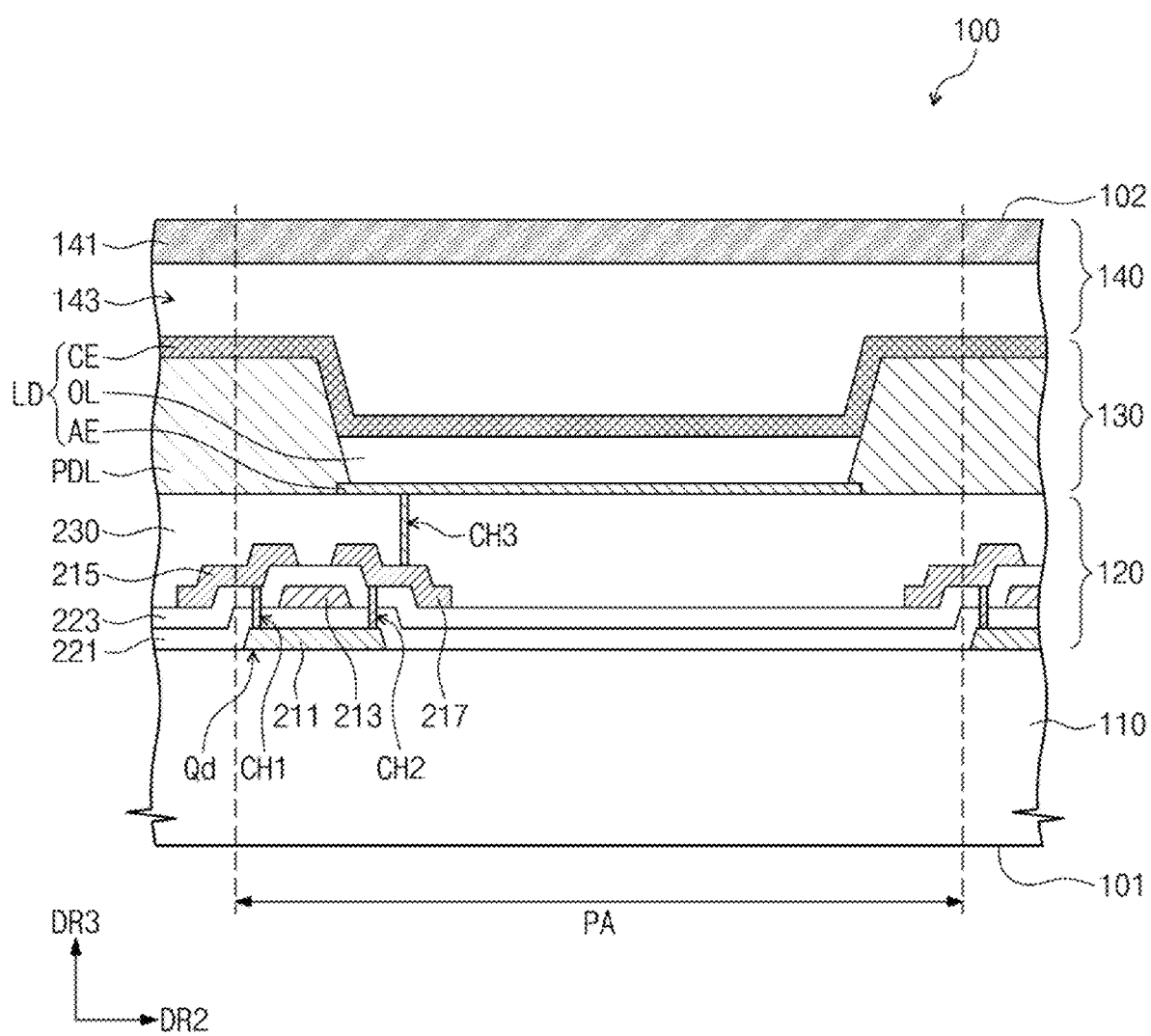
FIG. 12 is a cross-sectional view showing a display panel included in an organic light emitting display device according to an exemplary embodiment of the present invention.

FIG. 12 is a cross-sectional view showing a display panel included in an organic light emitting display device according to an exemplary embodiment of the present invention.

FIG. 12 shows one pixel area PA of the display panel according to an exemplary embodiment of the present invention. Referring to FIG. 12, one pixel is positioned in one pixel area PA; however, exemplary embodiments of the present invention are not limited thereto.

Referring to FIG. 12, the driving layer 120, the organic light emitting element layer 130, and the sealing layer 140 may be sequentially stacked on the base substrate 110 of the display panel 100.

A driving transistor Qd may include an active layer 211, a gate electrode 213, and a drain electrode 217.

The active layer 211 may be disposed on the base substrate 110. The driving layer 120 may include a first insulating layer 221 disposed between the active layer 211 and the gate electrode 213. The first insulating layer 221 may insulate the active layer 211 from the gate electrode 213. A source electrode 215 and the drain electrode 217 may be positioned above the gate electrode 213. The driving layer 120 may include a second insulating layer 223 disposed between the gate electrode 213 and the source electrode 215 and between the gate electrode 213 and the drain electrode 217. Each of the source electrode 215 and the drain electrode 217 may be in direct contact with the active layer 211 through contact holes CH1 and CH2 formed through the first insulating layer 221 and the second insulating layer 223.

The driving layer 120 may include a protective layer 230 disposed on the source electrode 215 and the drain electrode 217.

The display panel according to an exemplary embodiment of the present invention is not limited to the structure of the driving transistor Qd shown in FIG. 12. As an example, positions of the active layer 211, the gate electrode 213, the source electrode 215, and the drain electrode 217 may be changed, as desired. For example, the gate electrode 213 is disposed on the active layer 211 in FIG. 12, but the gate electrode 213 may be disposed under the active layer 211 according to another exemplary embodiment of the present invention.

A switching transistor may have the same structure as that of the driving transistor Qd. However, according to an exemplary embodiment of the present invention, the switching transistor and the driving transistor Qd may have different structures from each other. For example, an active layer of the switching transistor may be disposed on a different layer of the driving transistor Qd the active layer 211.

The organic light emitting element layer 130 may include an organic light emitting diode LD. In an exemplary embodiment of the present invention, the organic light emitting diode LD may be a front surface light emitting diode, and may emit light along the third direction DR3.

The organic light emitting diode LD may include a first electrode AE, an organic layer OL, and a second electrode CE.

The first electrode AE may be disposed on the protective layer 230. The first electrode AE may be connected to the drain electrode 217 through a contact hole CH3 formed in the protective layer 230.

The first electrode AE may serve as a pixel electrode or an anode electrode. The first electrode AE may be a transflective electrode or a reflective electrode. When the first electrode AE is the transflective electrode or a reflective electrode, the first electrode AE may include Ag, Mg, Al, Pt, Pd, Au, Ni, Nd, Ir, Cr, or a mixture thereof.

The first electrode AE may have a single-layer structure including a metal oxide material or a metal material or a multi-layer structure. For example, the first electrode AE may have a single-layer structure including ITO, Ag, or a metal mixture (e.g., a mixture of Ag and Mg), a double-layer structure of ITO/Mg or ITO/MgF, or a triple-layer structure of ITO/Ag/ITO; however, exemplary embodiments of the present invention are not limited thereto.

The organic layer OL may include an organic light emitting layer including of a relatively low molecular weight organic material or a relatively high molecular weight organic material. The organic light emitting layer may emit light. The organic layer OL may include a hole transport layer, a hole injection layer, an electron transport layer, and an electron injection layer in addition to the organic light emitting layer.

Holes and electrons may be injected into the organic light emitting layer of the organic layer OL respectively from the first electrode AE and the second electrode CE. The holes and electrons may be recombined in the organic light emitting layer to generate excitons, and the organic light emitting diode LD may emit light by the excitons that return to a ground state from an excited state.

The second electrode CE may be positioned above the organic layer OL. The second electrode CE may serve as a common electrode or a negative electrode. The second electrode CE may be a transmissive electrode or a transflective electrode. In the case that the second electrode CE is the transmissive electrode or a transflective electrode, the second electrode CE may include Li, Liq, Ca, LiF/Ca, LiF/Al, Al, Mg, BaF, Ba, Ag, a compound thereof, or a mixture thereof (e.g., a mixture of Ag and Mg).

The second electrode CE may include an auxiliary electrode. The auxiliary electrode may include a layer formed by depositing a material to face the organic light emitting layer and a layer including a transparent metal oxide formed on the layer. The layer including the transparent metal oxide may include indium tin oxide (ITO), indium zinc oxide (IZO), zinc oxide (ZnO), and/or indium tin zinc oxide (ITZO), and may further include Mo, Ti, and/or Ag.

The organic light emitting element layer 130 may include a pixel definition layer PDL disposed on the protective layer 230. The pixel definition layer PDL may overlap with a boundary between the pixel area PA when viewed in a plan view.

The sealing layer 140 may be disposed on the organic light emitting element layer 130. The sealing layer 140 may provide the upper surface 102 of the display panel 100. The sealing layer 140 may protect the organic light emitting element layer 130 from external moisture and oxygen. The sealing layer 140 may include a sealing substrate 141 and a sealing member. The sealing member may be disposed along an edge of the sealing substrate 141 to seal the organic light emitting diode LD with the sealing substrate 141. An inner space 143 defined by the sealing substrate 141 and the sealing member may be maintained in a vacuum state, however according to an exemplary embodiment of the present invention, the inner space 143 may be filled with nitrogen (N2) or a filling member of an insulating material.

According to an exemplary embodiment of the present invention, the sealing layer 140 may have a structure in which an organic layer and an inorganic layer are stacked multiple times.

Figure 13:
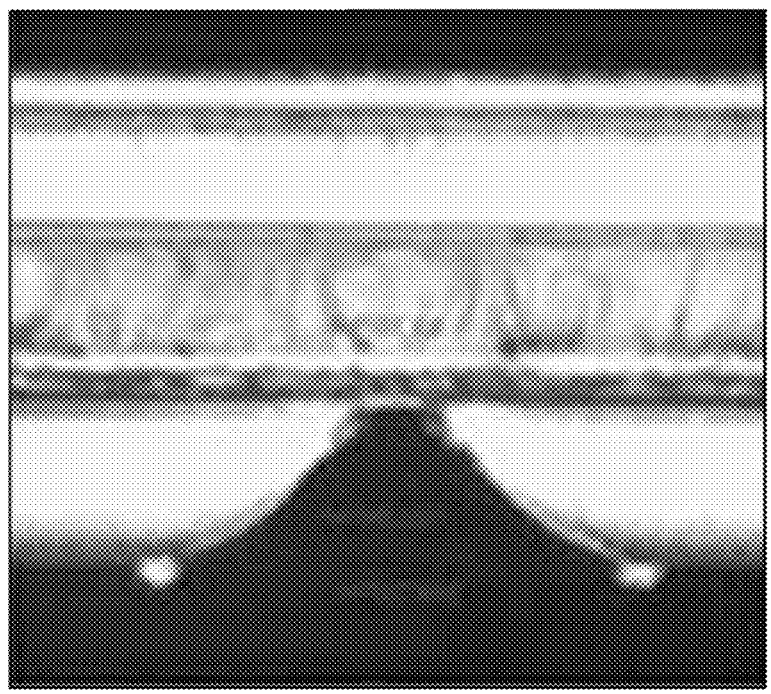
FIG. 13 is a microscopic image showing a portion of a conventional organic light emitting display device.
Figure 14A:
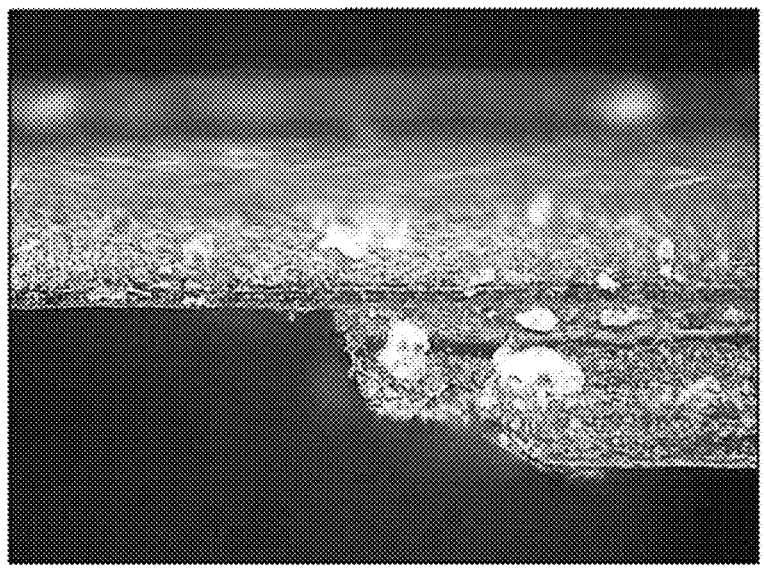
FIGS. 14A and 14B are microscopic images showing a portion of an organic light emitting display device according to an exemplary embodiment of the present invention.
Figure 14B:
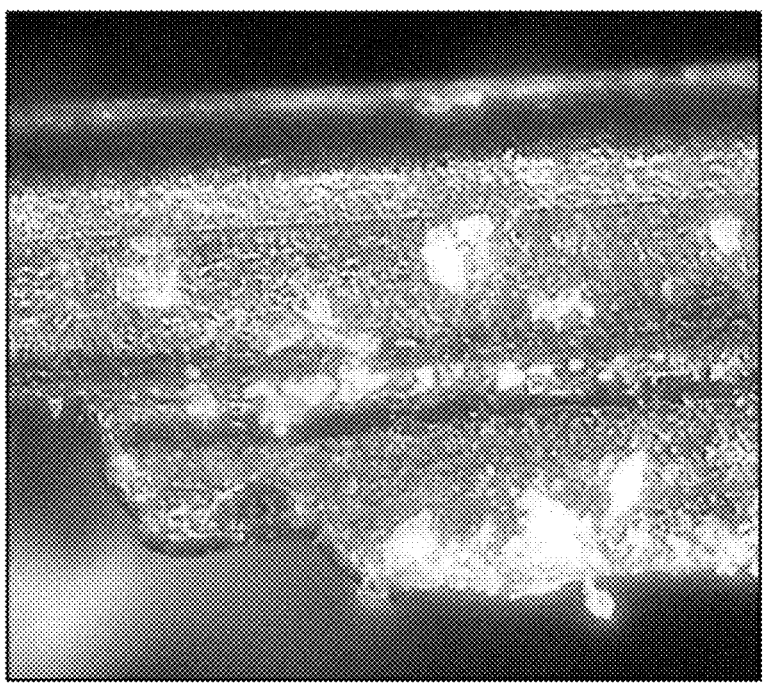

FIG. 13 is a microscopic image showing a portion of a conventional organic light emitting display device. FIG. 13 illustrates a microscopic image showing a groove defined by removing a portion of a film disposed on a surface of a display panel and a portion of an adhesive member disposed between the display panel and the film. FIGS. 14A and 14B are microscopic images showing a portion of an organic light emitting display device according to an exemplary embodiment of the present invention. FIGS. 14A and 14B illustrate microscopic images showing an inner surface of the first film in which the adhesive groove and the film groove are defined.

Referring to FIG. 13, according to the conventional display device in which the groove is formed by a laser process, a burr having a thickness of about 15 μm (micrometers) to about 25 μm (micrometers) is formed on the lower surface of the film, in which the groove is defined, due to the heat energy of the laser beam. Thus, due to the burr, bubbles may be generated between the film in which the groove is defined and a carrier film for a subsequent process, and thus, defects may be caused in a subsequent process. In addition, in the case that the burr having the thickness of about 15 micrometers to about 25 micrometers exists, an interference may be caused by the burr when the display device is bent. Further, as the radius of curvature decreases, the display device may be difficult to be bent at a desired radius of curvature.

Referring to FIGS. 14A and 14B, in the display device DP according to an exemplary embodiment of the present invention, the burr (e.g., the burr BR described with referenced to FIG. 7) formed by the laser process and the portion of the first film 200 may be removed by a subsequent process performed to remove the burr, and thus the groove GR see, e.g., FIG. 1) may have the stepped shape described herein. The display device DP according to an exemplary embodiment of the present invention might not include the burr or may include the burr having the relatively small thickness equal to or smaller than about 10 micrometers, and thus the various defects described herein may be reduced or prevented from occurring.

Figure 15:
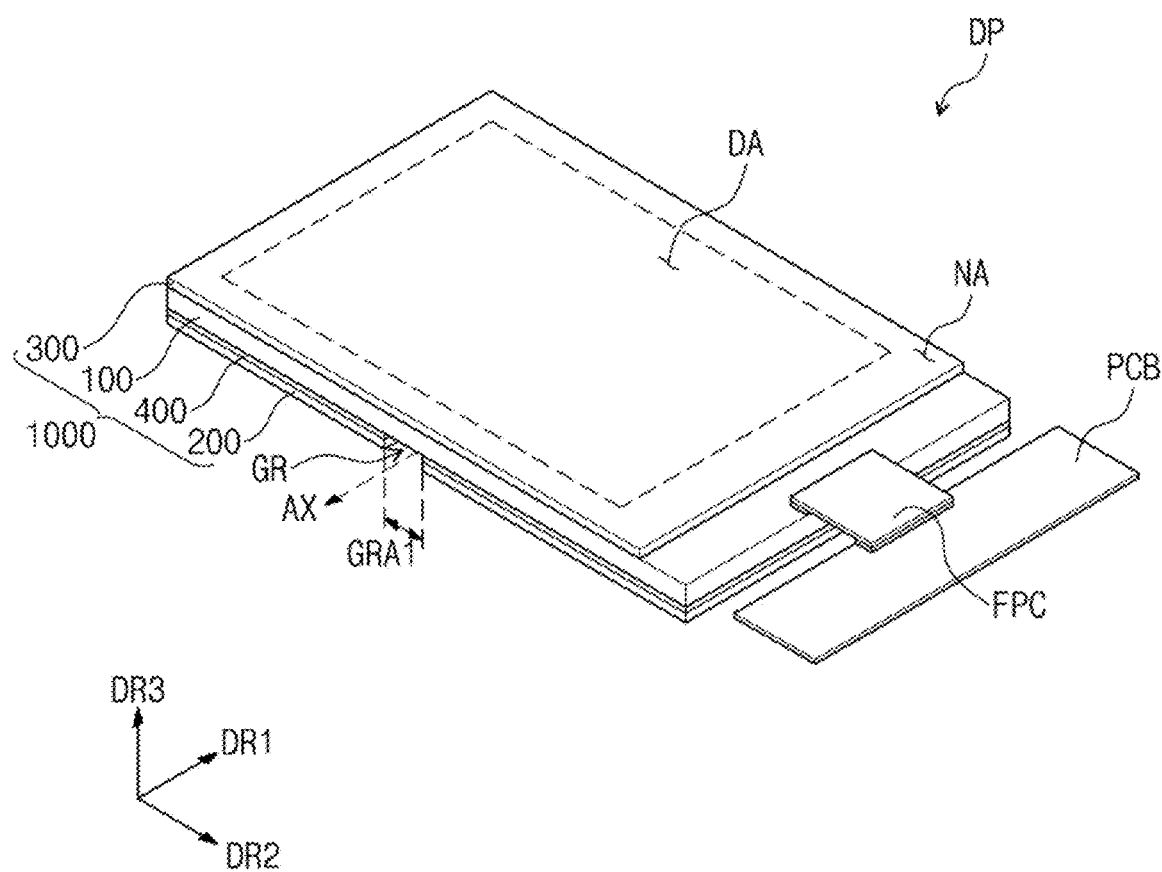
FIG. 15 is a perspective view showing an organic light emitting display device according to an exemplary embodiment of the present invention.
Figure 16:
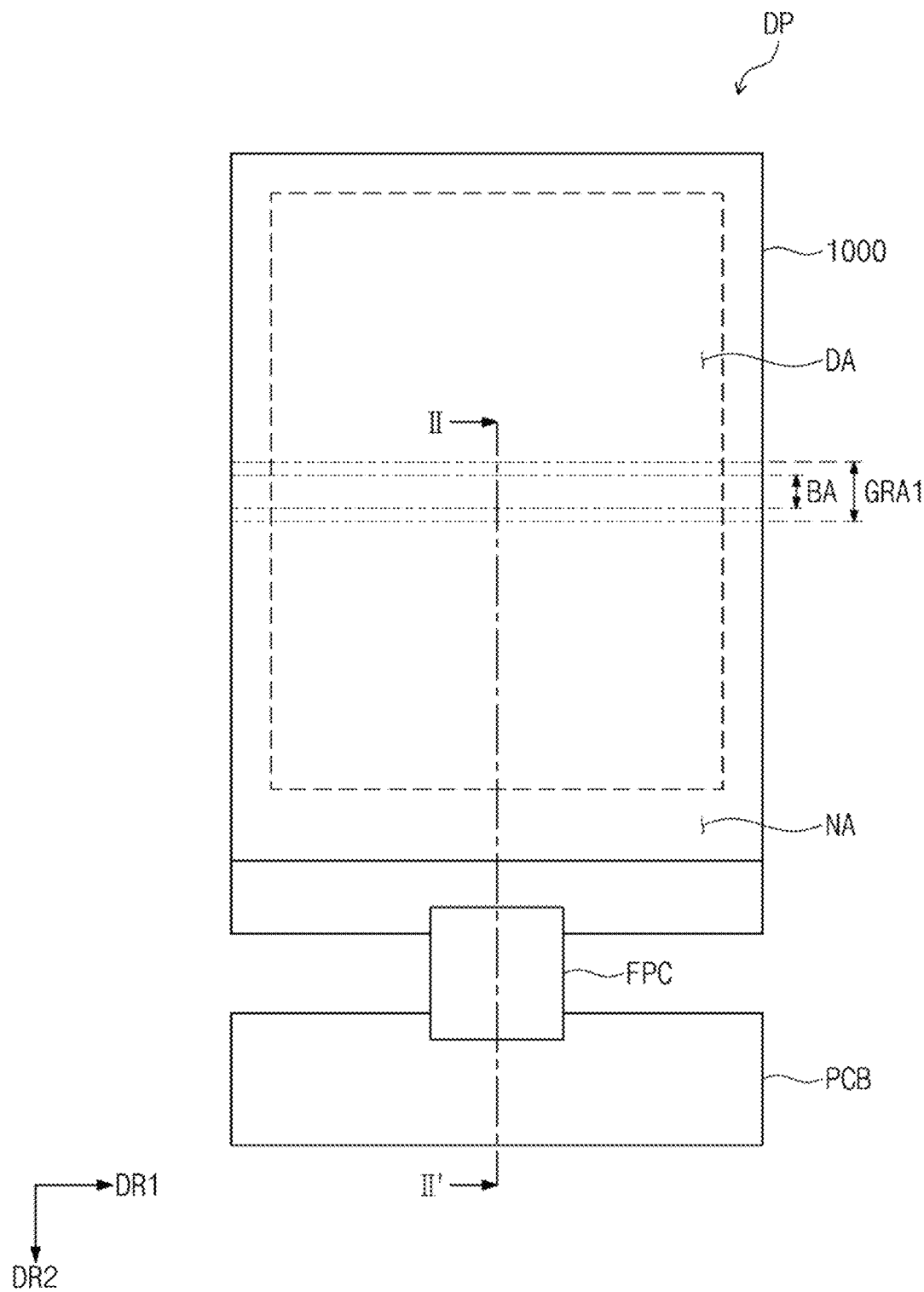
FIG. 16 is a plan view showing the organic light emitting display device of FIG. 15.
Figure 17:
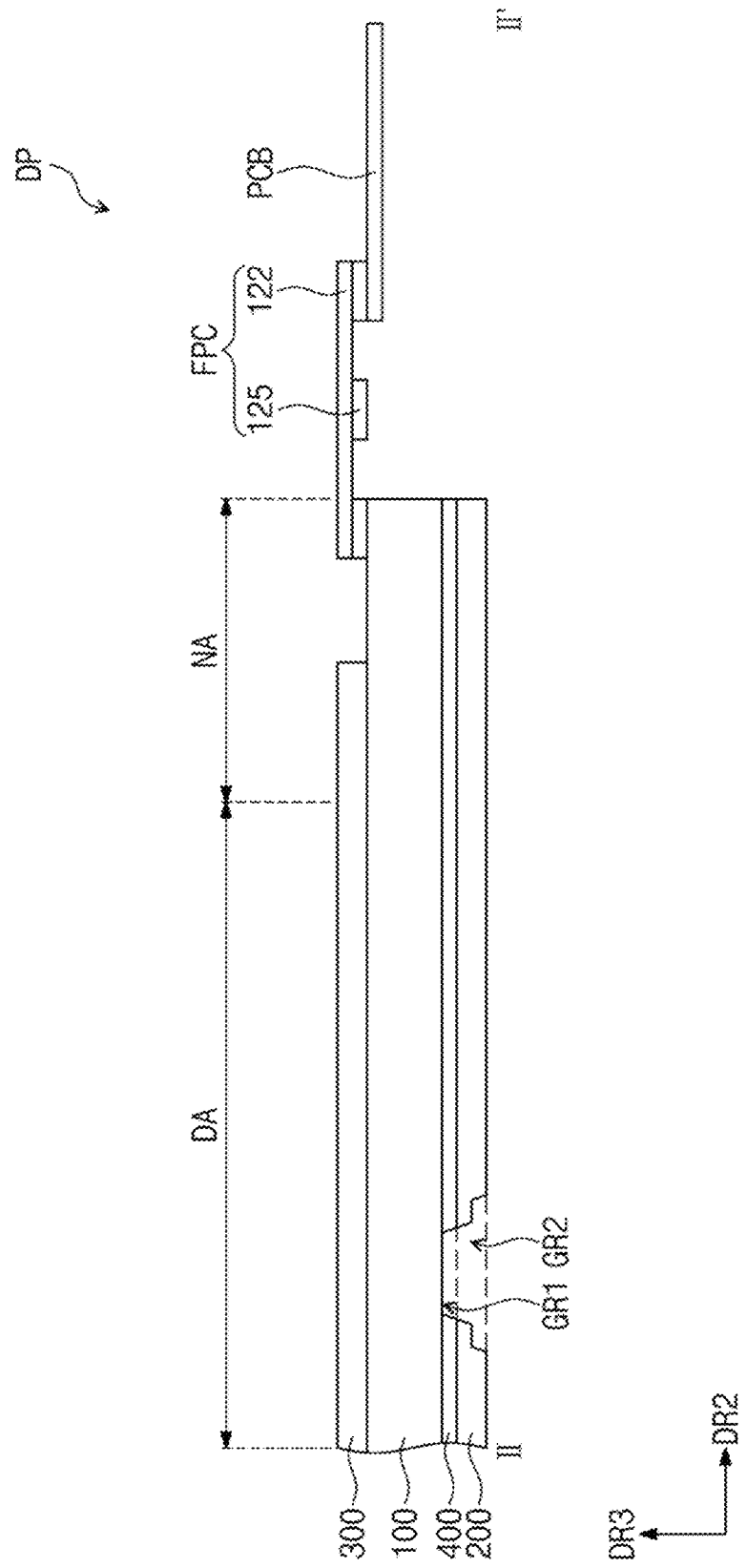
FIG. 17 is a cross-sectional view taken along a line II-II' of FIG. 16.
Figure 18:
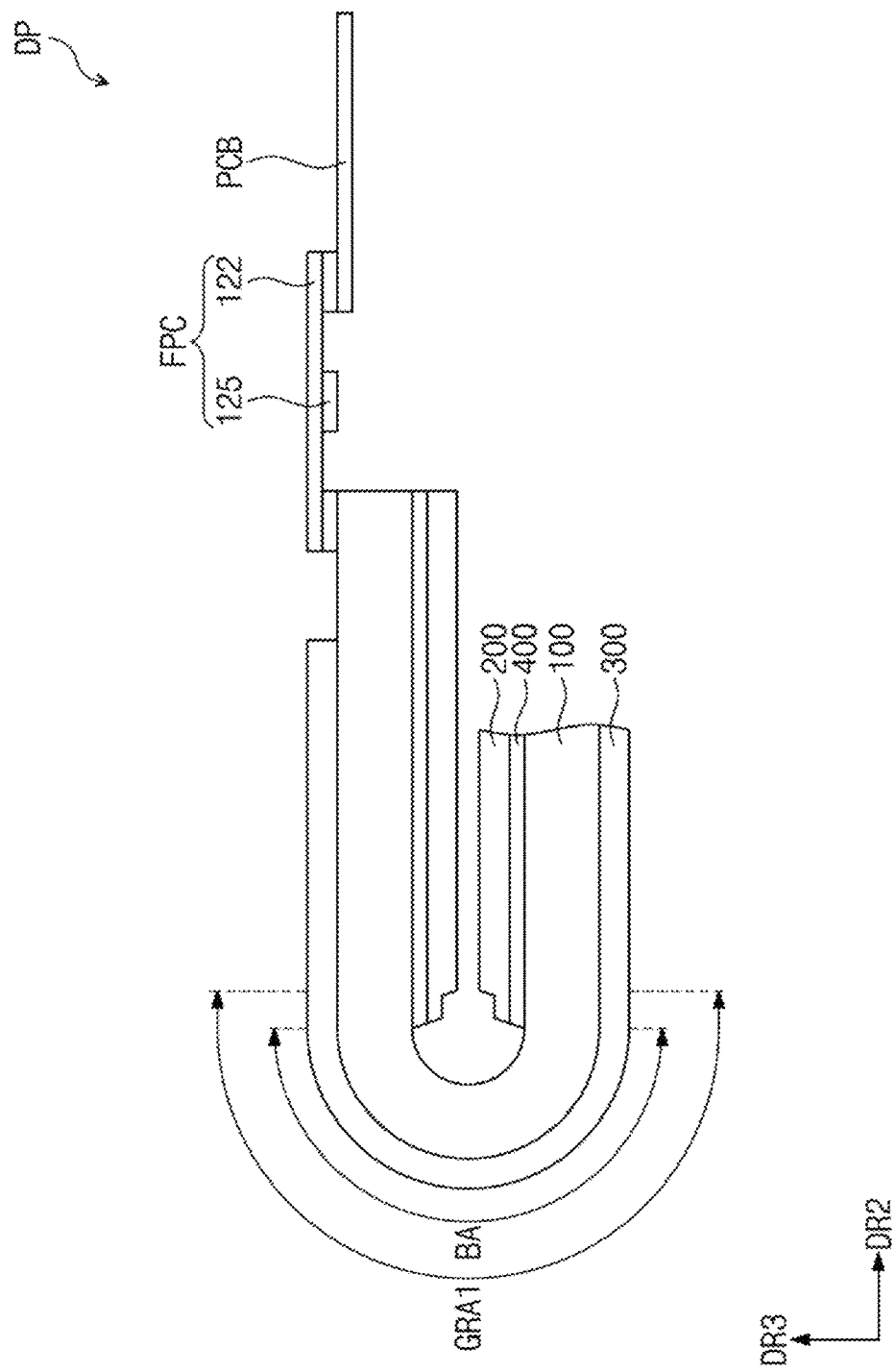
FIG. 18 is a cross-sectional view taken along a line II-II' to show the organic light emitting device that is bent.

FIG. 15 is a perspective view showing an organic light emitting display device according to an exemplary embodiment of the present invention. FIG. 16 is a plan view showing the organic light emitting display device of FIG. 15. FIG. 17 is a cross-sectional view taken along a line II-II' of FIG. 16. FIG. 18 is a cross-sectional view taken along a line II-II' to show the organic light emitting device that is bent.

FIG. 15 is a perspective view showing an organic light emitting display device DP according to an exemplary embodiment of the present invention. FIG. 16 is a plan view showing the organic light emitting display device DP of FIG. 15.

Referring to FIGS. 15 to 18, the organic light emitting display device DP may have substantially the same structure and function as those of the organic light emitting display device DP described with reference to FIGS. 1 to 4 except for a position of the first area GRA1 (e.g., a position of the groove GR). Thus, duplicative descriptions may be omitted below.

The first area GRA1 of the organic light emitting display device DP described with reference to FIGS. 14 to 18 may be defined in the display area DA. As an example, the first area GRA1 may be overlapped with the display area DA. The first area GRA1 may overlap the display area DA. As an example, the groove GR formed by removing a portion of the first film 200 and a portion of the adhesive layer 400 may be positioned in the display area DA.

As described above, the display module 1000 may be bent with respect to a reference axis AX extending in the first direction DR1. In this case, the reference axis AX may be defined in a lower portion of the display module 1000. The bending area BA may be overlapped with the display area DA and the non-display area NA.

The organic light emitting display device DP according to an exemplary embodiment of the present invention will be described in more detail below with reference to FIGS. 1 to 18. According to an exemplary embodiment of the present invention, the organic light emitting display device DP includes the display panel 100 including the lower surface 101, the upper surface 102, and the first area GRA1 defined therein, the first film 200 positioned under the lower surface 101 of the display panel 100 and including the film groove GR2 defined therein to overlap with the first area GRA1, the second film 300 disposed on the upper surface 102 of the display panel 100, and the adhesive layer 400 disposed between the lower surface 101 of the display panel 100 and the first film 200 and including the adhesive groove GR1 defined therein to overlap with the first area GRA1. The film groove GR2 may be stepped. The adhesive groove GR1 need not be stepped.

The display panel 100, the first film 200, the second film 300, the adhesive layer 400, the adhesive groove GR1, and the film groove GR2 may be substantially the same as described above, and thus duplicative descriptions thereof may be omitted below. The adhesive groove GR1 may have the first width WD1 in the second direction DR2, the film groove GR2 may include the first sub-film groove GR2-1 having the second width WD2 and the second sub-film groove GR2-2 having the third width WD3, and the first width WD1, the second width WD2, and the third width WD3 may satisfy the following Equation 1.

$$\text{first width} \leq \text{second width} \leq \text{third width} \qquad \text{Equation 1}$$

The first sub-film groove GR2-1 may be positioned between the adhesive groove GR1 and the second sub-film groove GR2-2.

As an example, the adhesive groove GR1 may have the first height H1 crossing the first width WD1, the first sub-film groove GR2-1 may have the second height H2 crossing the second width WD2, the second sub-film groove GR2-2 may have the third height H3 crossing the third width WD3. A sum of the first height H1 and the second height H2 may be greater than the third height.

Figure 19:
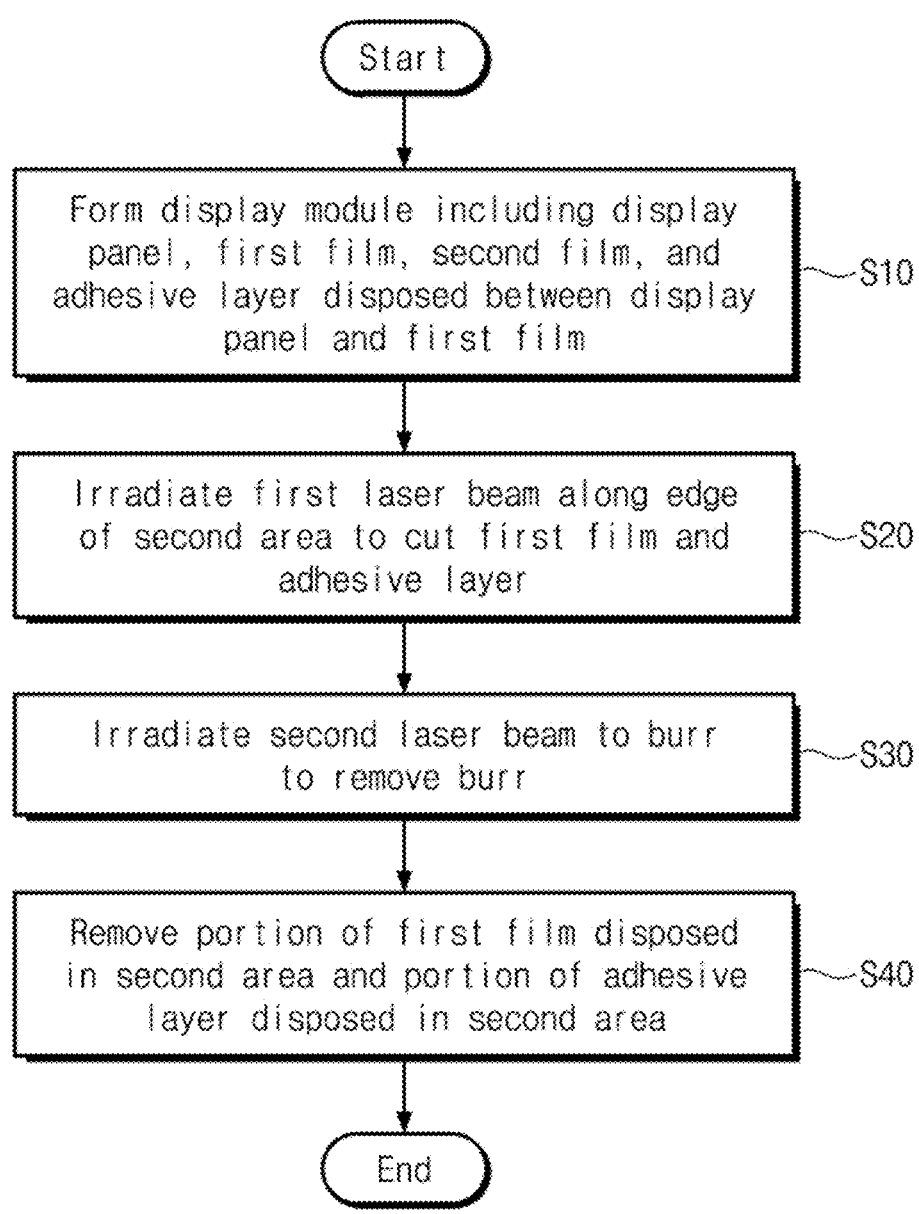
FIG. 19 is a flowchart showing a method of manufacturing a display device according to an exemplary embodiment of the present invention.
Figure 20:
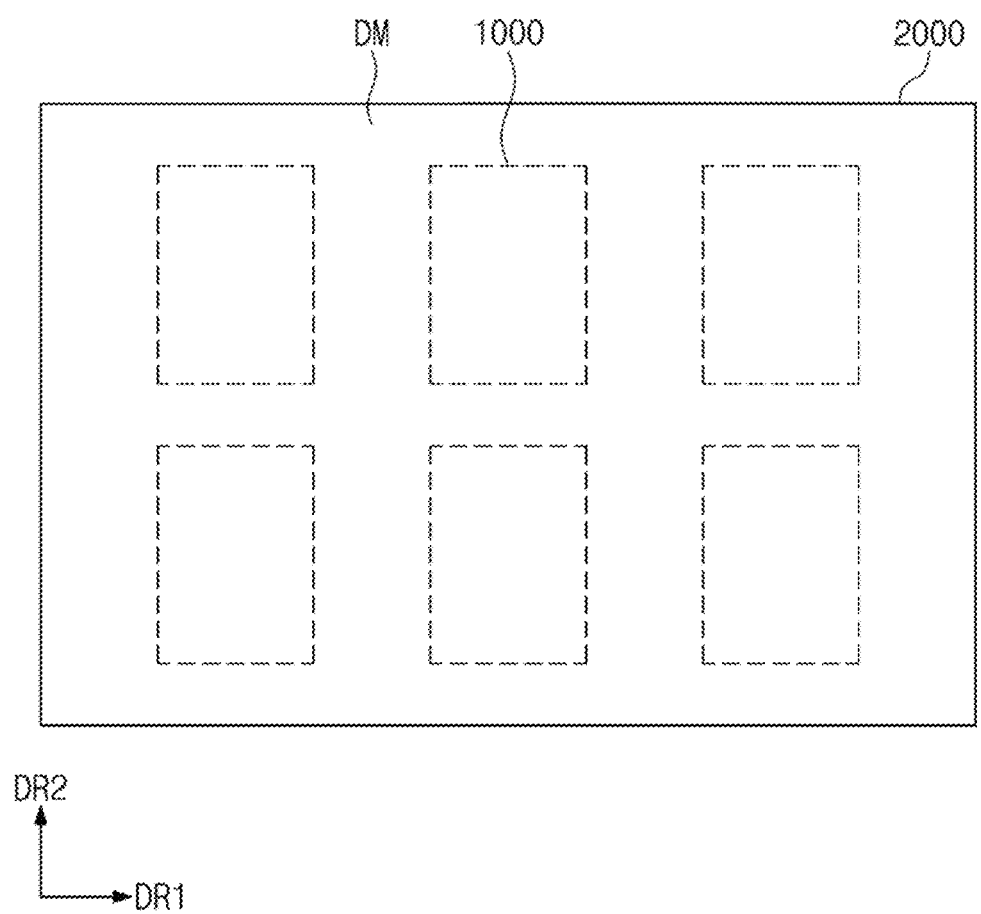
FIG. 20 is a plan view showing a mother substrate according to an exemplary embodiment of the present invention.

A method of manufacturing the display device according to an exemplary embodiment of the present invention will be described in more detail below with reference to FIGS. 19 to 27. FIG. 19 is a flowchart showing a method of manufacturing a display device according to an exemplary embodiment of the present invention. FIG. 20 is a plan view showing a mother substrate according to an exemplary embodiment of the present invention.

Referring to FIGS. 19 and 20, Step S10 may include: forming a display module, including a display panel, a first film, a second film, and an adhesive layer disposed between the display panel and the first film. For example, a mother substrate 2000 including the display module 1000 may be formed (S10).

The mother substrate 2000 may include a plurality of display modules 1000 and a dummy portion DM. The display modules 1000 may share one substrate.

Referring to FIG. 20, six display modules 1000 may be included in one mother substrate 2000, but the number of the display modules 1000 is not limited to six. For example, the number of the display modules 1000 included in one mother substrate 2000 may be greater or smaller than six.

The display modules 1000 and the dummy portion DM may be flexible, and thus the mother substrate 2000 may be flexible.

The dummy portion DM may be positioned between the display modules 1000. The dummy portion DM may be adjacent to an edge of each of the display modules 1000 to surround each of the display modules 1000 when viewed in a plan view. The dummy portion DM may be removed last in a manufacturing process according to an exemplary embodiment of the present invention.

Figure 21:
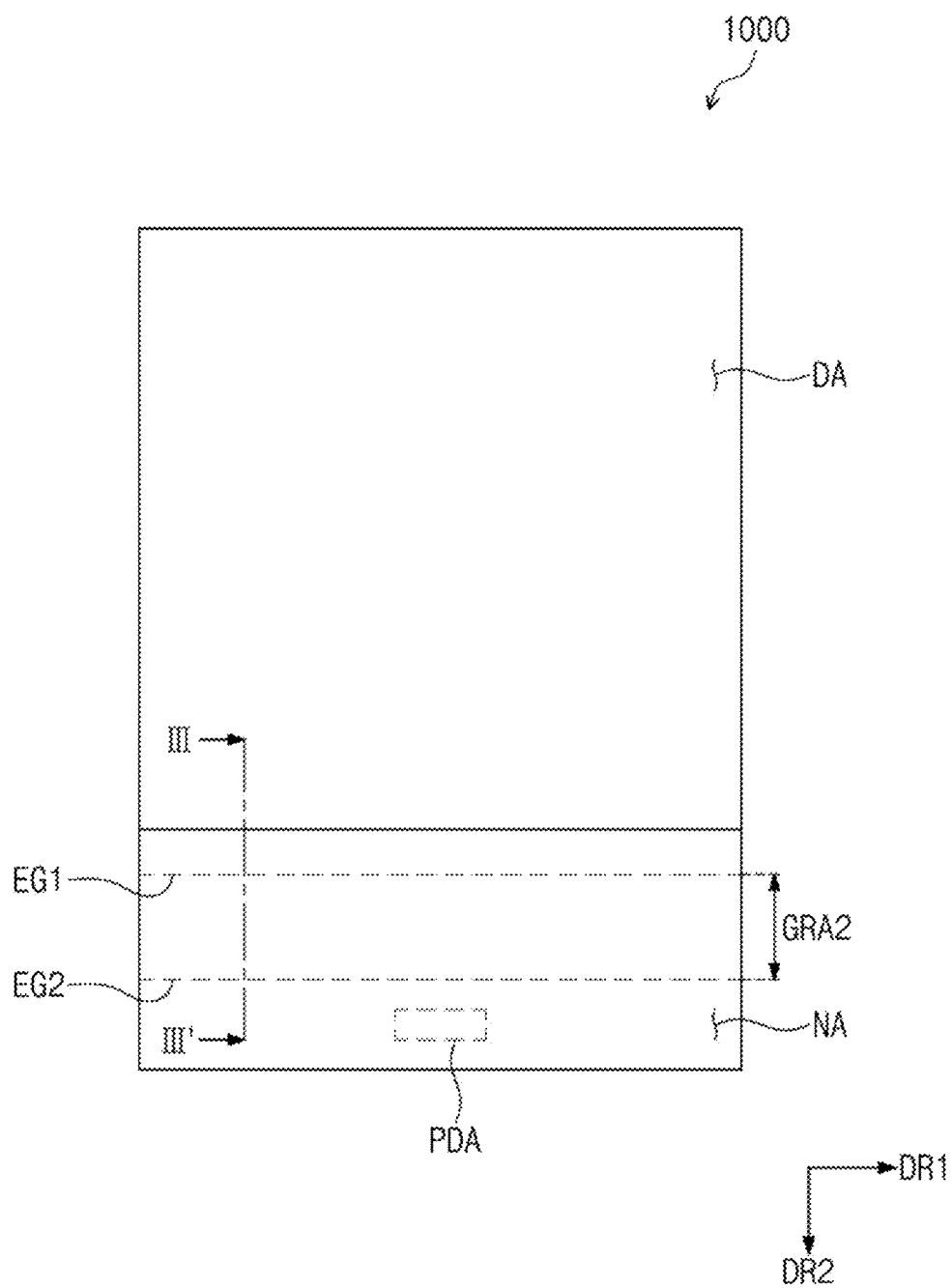
FIG. 21 is a plan view showing a display module of FIG. 20.

FIG. 21 is a plan view showing a display module of FIG. 20.

FIG. 21 shows the non-display area NA adjacent to one side of the display area DA. As an example, the display area DA and the non-display area NA may be adjacent to each other in the second direction DR2; however, exemplary embodiments of the present invention are not limited thereto. As an example, non-display areas may additionally be defined adjacent to the other three sides of the display area DA (see, e.g., FIG. 2).

A pad area PDA may be defined in the non-display area NA. The pad area PDA may be connected to the flexible printed circuit board FPC (see, e.g., FIG. 1), and the display module 1000 may receive signals for its operation through the pad area PDA.

A second area GRA2 may further be defined in the non-display area NA. The second area GRA2 may be defined between the pad area PDA and the display area DA and spaced apart from the pad area PDA and the display area DA; however, exemplary embodiments of the present invention are not limited thereto. The second area GRA2 may be overlapped with the display area DA. The second area GRA2 may be overlapped with an area in which the groove GR (see, e.g., FIG. 1) is defined when the organic light emitting display device according to the exemplary embodiment of the present invention is completely manufactured.

FIGS. 22 to 26 are cross-sectional views taken along a line of FIG. 21 during different stages of a manufacturing method of a display device according to an exemplary embodiment of the present invention.

Figure 22:
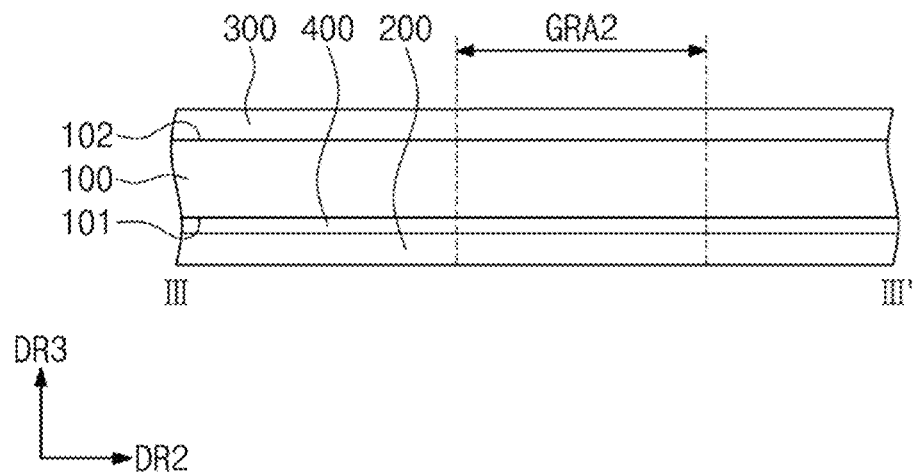
FIGS. 22 to 26 are cross-sectional views taken along a line of FIG. 21 during different stages of a manufacturing method of a display device according to an exemplary embodiment of the present invention.

Referring to FIG. 22, a display module, which includes the display panel 100 including the lower surface 101 and the upper surface 102 facing the lower surface 101, the first film 200 positioned below the lower surface 101 of the display panel 100, the second film 300 disposed on the upper surface 102 of the display panel 100, and the adhesive layer 400 disposed between the lower surface 101 of the display panel 100 and the first film 200, may be formed through the forming of the display module 1000 (e.g., Step S10, described above, and FIG. 20). The second area GRA2 may be defined in the display module.

Figure 23:
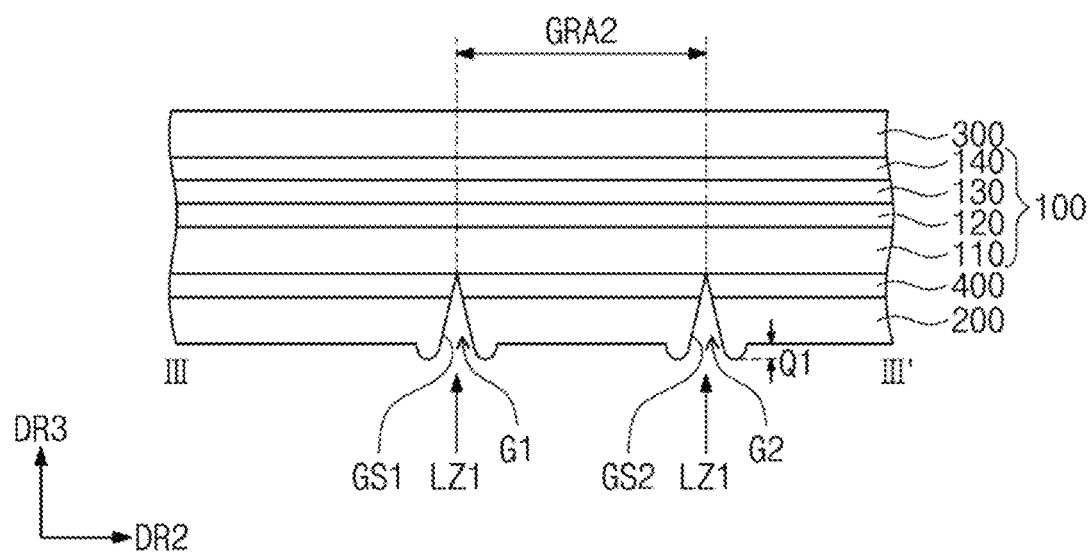

Referring to FIGS. 19, 21, and 23, Step S20 may include irradiating a first laser beam along an edge of a second area to cut a first film and an adhesive layer. Exemplary embodiments of the Step S20 will be described in more detail below.

For example, a first laser beam LZ 1 may be irradiated after the forming of the display module (see, e.g., Step S10 described above). The irradiating of the first laser beam LZ1 may be performed by irradiating the first laser beam LZ1 in the third direction DR3 from under the display module 1000 to cut the first film 200 and the adhesive layer 400. For example, the irradiating of the first laser beam LZ1 may include irradiating the first laser beam LZ1 along a first edge EG1 of the second area GRA2 and irradiating the first laser beam LZ1 along a second edge EG2 of the second area GRA2. The first laser beam LZ1 irradiated to the first edge EG1 and the first laser beam LZ1 irradiated to the second edge EG2 may have substantially a same intensity and speed as each other. The irradiating of the first laser beam LZ1 along the first edge EG1 of the second area GRA2 and the irradiating of the first laser beam LZ1 along the second edge EG2 of the second area GRA2 may be substantially simultaneously performed (e.g., performed as one operation); however, exemplary embodiments of the present invention are not limited thereto. For example, the irradiating of the first laser beam LZ1 along the second edge EG2 of the second area GRA2 may be performed after the irradiating of the first laser beam LZ1 along the first edge EG1 of the second area GRA2 is performed.

The first laser beam LZ1 may be irradiated once or twice in the irradiating of the first laser beam (S20), but it should not be limited thereto or thereby. Here, the term "irradiated twice" used herein means that the first laser beam LZ1 is irradiated twice to the same focal position. In terms of process economics, it is preferred that the first laser beam LZ1 is irradiated once in the irradiating of the first laser beam (S20). However, in terms of minimizing a damage applied to the display panel 100 by the first laser beam LZ1, it is preferred that the first laser beam LZ1 is irradiated twice in the irradiating of the first laser beam (S20). The number of irradiations of the first laser beam LZ1 in the irradiating of the first laser beam (S20) may be adjusted, if necessary.

The irradiating of the first laser beam may be performed by irradiating the first laser beam LZ1 in the third direction DR3 from under the display module 1000 to cut the first film 200 and the adhesive layer 400.

After the irradiating of the first laser beam, a first groove G1 may be formed in the first film 200 and the adhesive layer 400 to overlap with the first edge EG1 of the second area GRA2. A second groove G2 may be formed in the first film 200 and the adhesive layer 400 to overlap with the second edge EG2 of the second area GRA2.

The first groove G1 and the second groove G2 may have a shape in which a width thereof gradually decreases along the third direction DR3 toward the display panel 100. An inner surface GS1 of the first groove G1 and an inner surface GS2 of the second groove G2 may be inclined with respect to lower surface 101 of the display panel 100.

When the first laser beam LZ1 is irradiated in the irradiating of the first laser beam, a burr DB (which may be referred to herein as an "initial burr") may be formed on the lower surface of the first film 200 in direct contact with an edge of the first and second grooves G1 and G2. The initial burr DB may be formed on the lower surface of the first film 200 in direct contact with an edge of each of the first and second grooves G1 and G2. The initial burr DB may include a burr formed outside the second area GRA2 and a burr formed inside the second area GRA2. As described above, the initial burr DB may be formed by the portion of the first film 200, which is melted by the heat energy of the first laser beam LZ1. The initial burr DB may have a thickness Q1 equal to or greater than about 15 micrometers (μm) and equal to or smaller than about 25 micrometers (μm).

Referring to FIGS. 19 and 24, Step S30 may include irradiating a second laser beam to a burr to remove the burr. For example, a second laser beam LZ2 may be irradiated to the initial burr DB formed on the first film 200 disposed outside the second area GRA2 to remove the initial burr.

Step S40 may include removing a portion of a first film disposed in a second area and a portion of an adhesive layer disposed in the second area. For example, the initial burr DB formed on the lower surface of the first film 200 disposed inside the second area GRA2 may be removed with portions of the first film 200 and the adhesive layer 400. Thus, the second laser beam LZ2 need not be irradiated to the initial burr DB formed on the lower surface of the first film 200 disposed inside the second area GRA2 in terms of process economics.

In the irradiating of the second laser beam, the second laser beam LZ2 may be irradiated in the third direction DR3 from under the display module to remove the initial burr DB.

The focal position of the first laser beam LZ1 irradiated in the irradiating of the first laser beam may be different from the focal position of the second laser beam LZ2 irradiated in the irradiating of the second laser beam. The focal position of the first laser beam LZ1 and the focal position of the second laser beam LZ2 may be spaced apart from each other in the second direction DR2. The first laser beam LZ1 may be irradiated along an edge of the second area GRA2, and the second laser beam LZ2 may be irradiated to the initial burr DB formed on the lower surface of the first film disposed outside the second area GRA2.

Each of the first laser beam LZ1 and the second laser beam LZ2 may be irradiated using a $CO_2$ laser source or an UV laser source with relatively high energy efficiency; however, exemplary embodiments of the present invention are not limited thereto. For example, each of the first laser beam LZ1 and the second laser beam LZ2 may be a $CO_2$ laser beam.

The second laser beam LZ2 may have an energy intensity smaller than that of the first laser beam LZ1 since the second laser beam LZ2 is used to remove the initial burr DB formed in the irradiating of the first laser beam. However, according to an exemplary embodiment of the present invention, the second laser beam LZ2 may have substantially the same energy intensity as that of the first laser beam LZ1. When the second laser beam LZ2 has substantially the same energy intensity as that of the first laser beam LZ1, the second laser beam LZ2 may have a different irradiation speed from that of the first laser beam LZ1. For example, the irradiation speed of the second laser beam LZ2 may be faster than the irradiation speed of the first laser beam LZ1; however, exemplary embodiments of the present invention are not limited thereto. As an example, the irradiation speed of the second laser beam LZ2 may be substantially the same as the irradiation speed of the first laser beam LZ1. As another example, the intensity of the second laser beam LZ2 may be weaker than the intensity of the first laser beam LZ1, but the irradiation speed of the second laser beam LZ2 may be faster than the irradiation speed of the first laser beam LZ1.

Figure 25:
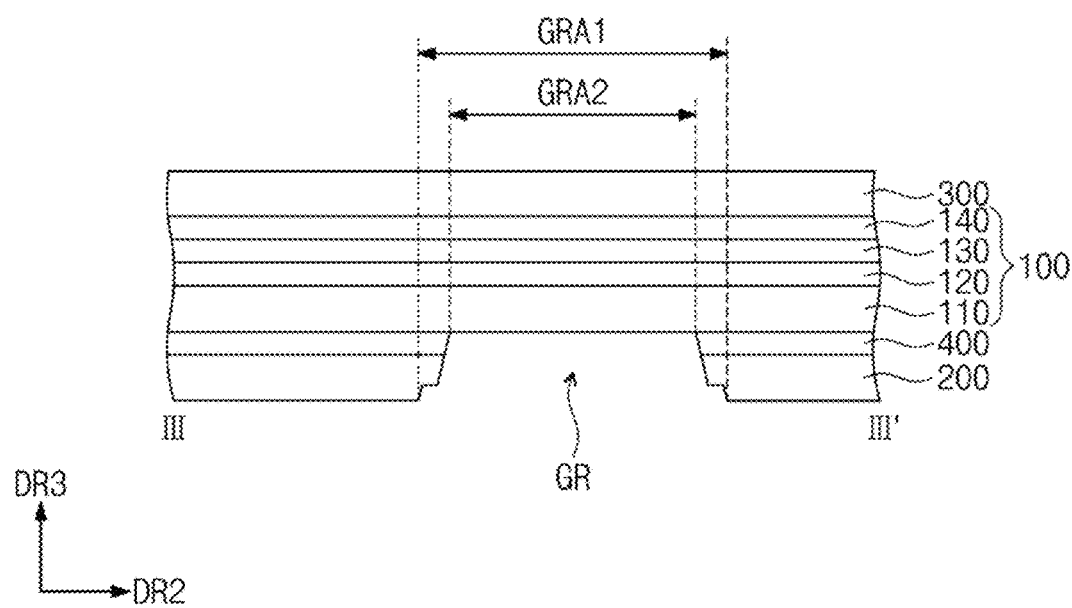

Referring to FIGS. 19 and 25, after the irradiating of the second laser beam LZ2 is performed, the initial burr DB may be substantially completely removed and the portion of the first film 200 may be removed. As an example, the initial burr DB may be substantially completely removed by the irradiating of the second laser beam, and the portion of the first film 200 may be substantially simultaneously removed with the initial burr DB.

Then, the portion of the first film 200 and the portion of the adhesive layer 400, which are positioned in the second area GRA2, may be removed (S40). The irradiating of the second laser beam (S30) is preferred to be performed after the irradiating of the first laser beam (S20) but before the removing of the portion of the first film 200 and the portion of the adhesive layer 400.

When the removing of the portion of the first film 200 and the portion of the adhesive layer 400, which are positioned in the second area GRA2, is performed, the groove GR may be formed by removing the portion of the first film 200 and the portion of the adhesive layer 400. The groove GR may be overlapped with the first area GRA1. The second area GRA2 may be defined in the first area GRA1. The first area GRA1 may have a width greater than a width of the second area GRA2. The groove GR may have the stepped shape due to the irradiation of the second laser beam LZ2. The groove GR may have the plane figure defined by the five line segments. One side surface of the groove GR may be stepped. The groove GR may have the shape in which the width thereof gradually decreases along the third direction DR3 toward the display panel 100.

Figure 26:
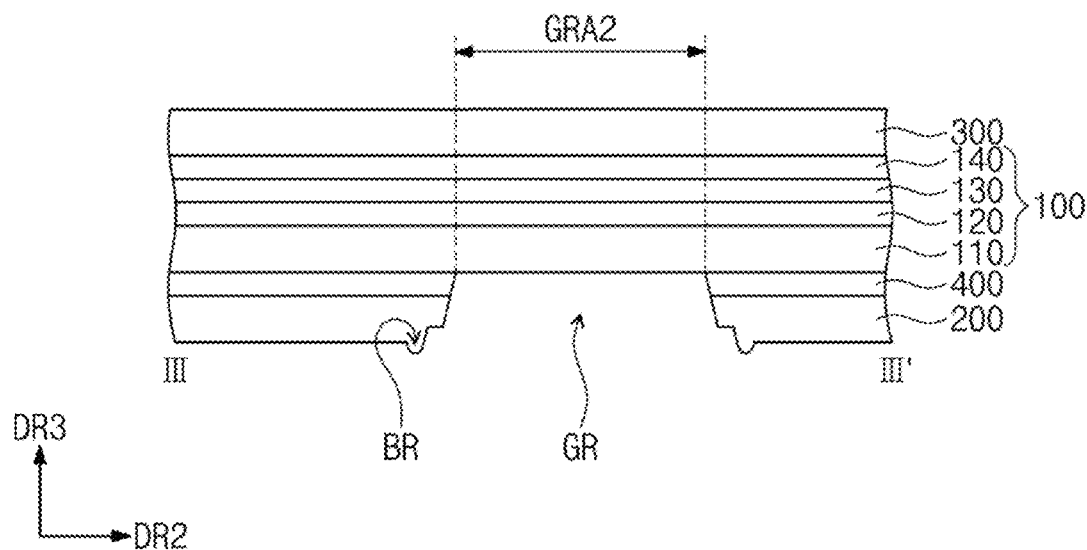

Referring to FIGS. 19 and 26, due to the heat energy of the second laser beam LZ2 irradiated in the irradiation of the second laser beam, the bur BR (which may be referred to herein as a "final burr") may be formed on the lower surface of the first film 200 in direct contact with an edge of the groove GR. The final burr BR may have a thickness smaller than the thickness of the initial burr DB. The final burr BR may be formed in the irradiating of the second laser beam performed to remove the initial burr DB and may have a volume smaller than that of the initial burr DB. For example, the initial burr DB may have the thickness equal to or greater than about 15 micrometers (μm) and equal to or smaller than about 25 micrometers (μm), and the final burr BR may have the thickness equal to or greater than about 1 micrometer (μm) and equal to or smaller than about 10 micrometers (μm) or equal to or greater than about 1 micrometer (μm) and equal to or smaller than about 7 micrometers (μm).

Referring to FIGS. 1, 4, and 21, the manufacturing method of the display device according to an exemplary embodiment of the present invention may further include bending the display module 1000. For example, the display module 1000 may be bent with respect to the reference axis AX defined in the second area GRA2 and extending in the first direction DR1 by the bending of the display module 1000. The bending of the display module 1000 may be performed after the removing of the portion of the first film 200 and the portion of the adhesive layer 400.

Figure 27:
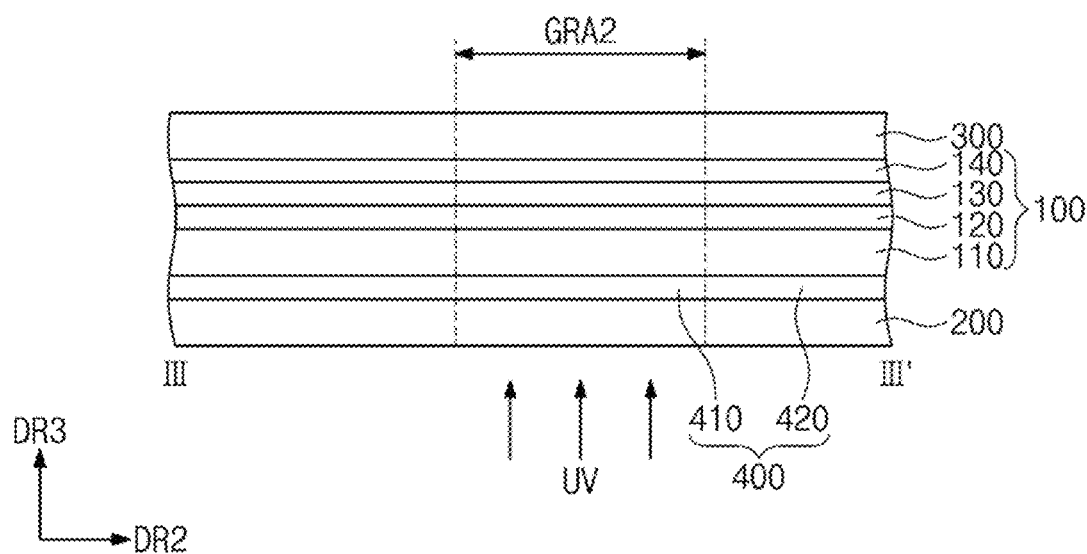
FIG. 27 is a cross-sectional view taken along a line of FIG. 21 during a stage of a manufacturing method of a display device according to an exemplary embodiment of the present invention.

FIG. 27 is a cross-sectional view taken along a line of FIG. 21 during a stage of a manufacturing method of a display device according to an exemplary embodiment of the present invention.

Referring to FIGS. 19, 23, and 27, the manufacturing method of the display device according to an exemplary embodiment of the present invention may further include weakening an adhesive force. The weakening of the adhesive force may weaken an adhesive force of a first adhesive portion 410 disposed in the second area GRA2 of the adhesive layer 400 to be weaker than an adhesive force of a second adhesive portion 420 disposed outside the second area GRA2 of the adhesive layer 400. The weakening of the adhesive force may be performed after the forming of the display module (e.g., Step S10 described above in more detail) and before the irradiating of the first laser beam (e.g., Step S20 described above in more detail). When the weakening of the adhesive force is performed after irradiating of the first laser beam, an ultraviolet UV light irradiated in the third direction DR3 in the weakening of the adhesive force may be refracted by the inner surface GS1 of the first groove G1 and the inner surface GS2 of the second groove G2. Thus, the ultraviolet UV light may be irradiated to an area smaller than the second area GRA2. Thus, the adhesive force of the adhesive layer positioned at an edge of the second area GRA2 need not be weakened. However, exemplary embodiments of the present invention do not exclude irradiating of the first laser beam prior to the weakening of the adhesive force.

The weakening of the adhesive force may be performed by irradiating the ultraviolet UV light to the second area GRA2 along the third direction DR3. When the ultraviolet UV light is irradiated, the adhesive force between the first adhesive portion 410 and the base substrate 110 may be weakened. The adhesive force between the first adhesive portion 410 and the base substrate 110 may be weakened because carbide is generated on the lower surface 101 of the base substrate 110 due to the ultraviolet UV light or a variation in surface roughness of the lower surface 101 of the base substrate 110.

When the adhesive force of the first adhesive portion 410 is not weakened, the portion of the first film 200 and the first adhesive portion 410 in the second area GRA2 may be more rigidly adhered to each other, and thus the base substrate 110 may be damaged while the portion of the first film 200 and the first adhesive portion 410 are removed. Due to the weakening of the adhesive force, the first adhesive portion 410 and the portion of the first film may be stably removed (e.g., during the process described below in more detail).

According to the manufacturing method of the display device according to an exemplary embodiment of the present invention, the adhesive layer 400 and the first film 200 may be formed over the display panel 100. The portion of the adhesive layer 400 and the portion of the first film 100, which are positioned in a target area, may be removed through the laser beam process described herein. The initial burr DB formed during the laser beam process may be substantially removed. Thus, defects may be reduced or prevented from occurring. According to the manufacturing method of the display device according to an exemplary embodiment of the present invention, the manufacturing process of the display device may be simplified when compared with a manufacturing method of attaching a first film from which a target area is removed to the display panel 100, and thus a manufacturing cost of the display device may be reduced.

While the present invention has been shown and described with reference to the exemplary embodiments thereof, it will be apparent to those of ordinary skill in the art that various changes in form and detail may be made thereto without departing from the spirit and scope of the present invention.

What is claimed is:
1. A display device comprising:
a display panel;
a film disposed under the display panel; and
a groove defined in the film,
wherein the film comprises an upper surface facing the display panel, a lower surface facing the upper surface, a side surface defining the groove and having a step shape, and a protruding portion, and
wherein the protruding portion of the film corresponds to a portion of the lower surface protruding adjacent to the side surface of the film, wherein the side surface of the film has a first inclined surface, a connecting surface, and a second inclined surface,
wherein a length of the first inclined surface is greater than a length of the second inclined surface, when viewed in cross section, and
wherein the protruding portion of the film is adjacent to the second inclined surface.

2. The display device of claim 1,
wherein the second inclined surface of the film has a curved surface.

3. The display device of claim 1,
wherein the first inclined surface is adjacent to the display panel and is inclined at a first angle with respect to the display panel,
wherein the second inclined surface is farther away from the display panel than the first inclined surface and is inclined at a second angle smaller than the first angle with respect to the display panel, and
wherein each of the first angle and the second angle is acute angle.

4. The display device of claim 1,
wherein a thickness of the protruding portion is 10 micrometers or less.

5. The display device of claim 1, further comprising:
an adhesive layer disposed between the display panel and the film.

6. The display device of claim 5,
wherein a portion of the adhesive layer overlapping the groove is removed.

7. The display device of claim 1,
wherein the display panel comprises a display area displaying an image and a non-display area disposed adjacent to the display area, and the groove is overlapped with the non-display area.

8. A display device comprising:
a display panel;
a film disposed under the display panel;
a groove in the film,
wherein the film comprises a first film portion, and a second film portion adjacent to the first film portion and thinner than the first film portion,
wherein the first film portion is disposed between the display panel and the second film portion;
wherein the groove is defined by a first flat side surface of the first film portion and a second curved side surface of the second film portion,
wherein the second curved side surface is directly connected to the first flat side surface, and
wherein as extending away from a boundary line between the first film portion and the second film portion, the second curved side surface has an increasing tangential angle, and
wherein the increasing tangential angle is an acute angle.

9. The display device of claim 8,
wherein a length of the first flat side surface is greater than a length of the second curved side surface, when viewed in cross section.

10. The display device of claim 8,
wherein a degree of inclination of the first flat side surface is greater than a minimum angle of the increasing tangent angle and less than a maximum angle of the increasing tangent angle.

11. The display device of claim 8, further comprising:
a protruding portion protruding in a direction away from the display panel from a portion of the second film portion adjacent to the second curved side surface.

12. The display device of claim 8,
wherein a bottom surface of the first film portion spaced apart from the display panel is connected to the first flat side surface and the second curved side surface.

13. The display device of claim 12,
wherein a width of the bottom surface in a first direction is smaller than a width of the groove in the first direction.

14. The display device of claim 8,
wherein the display panel comprises a display area displaying an image and a non-display area disposed adjacent to the display area, and
wherein the groove is overlapped with the non-display area.

15. A display device comprising:
a display panel;
a film disposed under the display panel; and
a groove disposed in the film,
wherein the film comprises a first film portion, and a second film portion adjacent to the first film portion and thinner than the first film portion,
wherein the first film portion is disposed between the display panel and the second film portion;
wherein the groove has a stepped side surface which is defined by a first side surface of the first film portion, a connecting surface of the first film portion, and a second side surface of the second film portion,
wherein the connecting surface of the first film portion connects the first side surface of the first film portion and the second side surface of the second film portion to each other,
wherein a first degree of inclination of the first side surface is greater than a second degree of inclination of the second side surface, and
wherein a third degree of inclination of the connection surface is less than each of the first degree and the second degree.

16. The display device of claim 15,
wherein a length of the first side surface is greater than a length of the second side surface, when viewed in cross section.

17. The display device of claim 15,
wherein the display panel comprises a display area displaying an image and a non-display area disposed adjacent to the display area, and
wherein the groove is overlapped with the non-display area.

18. A display device comprising:
a display panel including a first area, a second area, and a third area that are sequentially defined; and
a film including a first film layer disposed on a first rear surface of the first area of the display panel and a second film layer spaced apart from the first film layer and disposed on a second rear surface of the third area of the display panel,
wherein the second area is bent toward the first rear surface of the first area of the display panel,
wherein the first film layer and the second film layer face each other and are disposed between the first area of the display panel and third area of the display panel,
wherein the first film layer includes a first protruding portion where a portion of one surface of the first film layer adjacent to a first inclined stepped side surface of the first film layer protrudes,
wherein the second film layer includes a second protruding portion where a portion of one surface of the second film layer adjacent to a second inclined stepped side surface of the second film layer protrudes, and wherein each of the first and second inclined stepped side surfaces has a first inclined surface, a connecting surface, and a second inclined surface, wherein a length of the first inclined surface is greater than a length of the second inclined surface in each of the first and second inclined stepped side surfaces, when viewed in cross section, and wherein each of the first and second protruding portions is adjacent to the second inclined surface of the each of the first and second film layers, respectively.

19. The display device of claim 18, wherein each of the first inclined stepped side surface of the first film layer and the second inclined stepped side surface of the second film layer faces the second area of the display panel.

20. The display device of claim 18, wherein a thickness of each of the first protruding portion and the second protruding portion is 10 micrometers or less.

\* \* \* \* \*